US012787800B2

(12) United States Patent
Ikeda

(10) Patent No.: US 12,787,800 B2
(45) Date of Patent: Nov. 3, 2026

(54) SEMICONDUCTOR DEVICE WITH DIFFERENT SIDE SURFACES THICKNESS FOR A PLURALITY OF LEADS THAT EXTEND OUTSIDE THE PACKAGE

(71) Applicant: Rohm Co., Ltd., Kyoto (JP)

(72) Inventor: Masato Ikeda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 350 days.

(21) Appl. No.: 18/657,358

(22) Filed: May 7, 2024

(65) Prior Publication Data

US 2024/0297102 A1 Sep. 5, 2024

Related U.S. Application Data

(63) Continuation of application No. PCT/JP2022/039095, filed on Oct. 20, 2022.

(30) Foreign Application Priority Data

Nov. 12, 2021 (JP) ................................. 2021-185249

(51) Int. Cl.
*H10W 70/40* (2026.01)
*H10W 72/00* (2026.01)
(Continued)

(52) U.S. Cl.
CPC ....... *H10W 70/424* (2026.01); *H10W 70/417* (2026.01); *H10W 74/111* (2026.01);
(Continued)

(58) Field of Classification Search
CPC ............. H10W 70/424; H10W 70/417; H10W 70/411; H10W 70/465; H10W 74/00;
(Continued)

(56) References Cited

U.S. PATENT DOCUMENTS 9,966,517 B2 * 5/2018 Oda .................. H10H 20/8506
10,141,246 B2 * 11/2018 Talledo .................. H10P 54/00
(Continued)

FOREIGN PATENT DOCUMENTS

JP 2018-190875 11/2018

OTHER PUBLICATIONS

International Search Report issued in International Application No. PCT/JP2022/039095, Dec. 13, 2022, 2 pages.
(Continued)

*Primary Examiner* — Alonzo Chambliss
(74) *Attorney, Agent, or Firm* — HSML P.C.

(57) ABSTRACT

A semiconductor device includes a plurality of terminals arranged along a first direction, a semiconductor element electrically connected to at least one of the plurality of terminals, and a sealing resin covering a part of each of the plurality of terminals and covering the semiconductor element. Each of the plurality of terminals includes a mount surface exposed from the sealing resin, and a side surface. The plurality of terminals include a first terminal located closest to one end in the first direction of the sealing resin and a second terminal spaced apart from the first terminal. The dimension in the thickness direction of the side surface of the second terminal differs from the dimension in the thickness of the side surface of the first terminal.

17 Claims, 17 Drawing Sheets

(51) Int. Cl.
*H10W 72/50* (2026.01)
*H10W 74/10* (2026.01)
*H10W 90/00* (2026.01)

(52) U.S. Cl.
CPC ........ *H10W 70/411* (2026.01); *H10W 70/456* (2026.01); *H10W 70/465* (2026.01); *H10W 72/075* (2026.01); *H10W 72/50* (2026.01); *H10W 90/756* (2026.01)

(58) Field of Classification Search
CPC . H10W 74/111; H10W 72/50; H10W 90/756; H10W 72/075; H10W 90/00
See application file for complete search history.

(56) References Cited

U.S. PATENT DOCUMENTS

2010/0013069 A1* 1/2010 Kasuya ............... H10W 70/424
257/676
2016/0254214 A1* 9/2016 Makino ................... H10P 14/47
257/676
2020/0075440 A1* 3/2020 Majima ............... H10W 70/421

OTHER PUBLICATIONS

Written Opinion issued in International Application No. PCT/JP2022/039095, Dec. 13, 2022, 2 pages.

* cited by examiner

SEMICONDUCTOR DEVICE WITH DIFFERENT SIDE SURFACES THICKNESS FOR A PLURALITY OF LEADS THAT EXTEND OUTSIDE THE PACKAGE

TECHNICAL FIELD

The present disclosure relates to a semiconductor device.

BACKGROUND ART

JP-A-2018-190875 discloses an example of a semiconductor device that includes a plurality of terminals arranged along a predetermined direction, a semiconductor element electrically connected to at least one of the terminals, and a sealing resin covering a part of each of the terminals and the semiconductor element. Each terminal has a terminal reverse surface and a terminal outer side surface that are exposed from the sealing resin. When the semiconductor device is mounted on a wiring board, similar solder fillets are formed on the terminal outer side surfaces of the terminals.

Formation of solder fillets contributes to an increase in the bonding strength of the semiconductor device to the wiring board. However, during the use of the semiconductor device disclosed in JP-A-2018-190875, different thermal stresses are exerted on the plurality of terminals. This may result in a crack occurring in the solder fillet formed on a certain terminal.

DETAILED DESCRIPTION OF EMBODIMENTS

The following describes modes for carrying out the present disclosure with reference to the drawings.

First Embodiment

Figure 1:
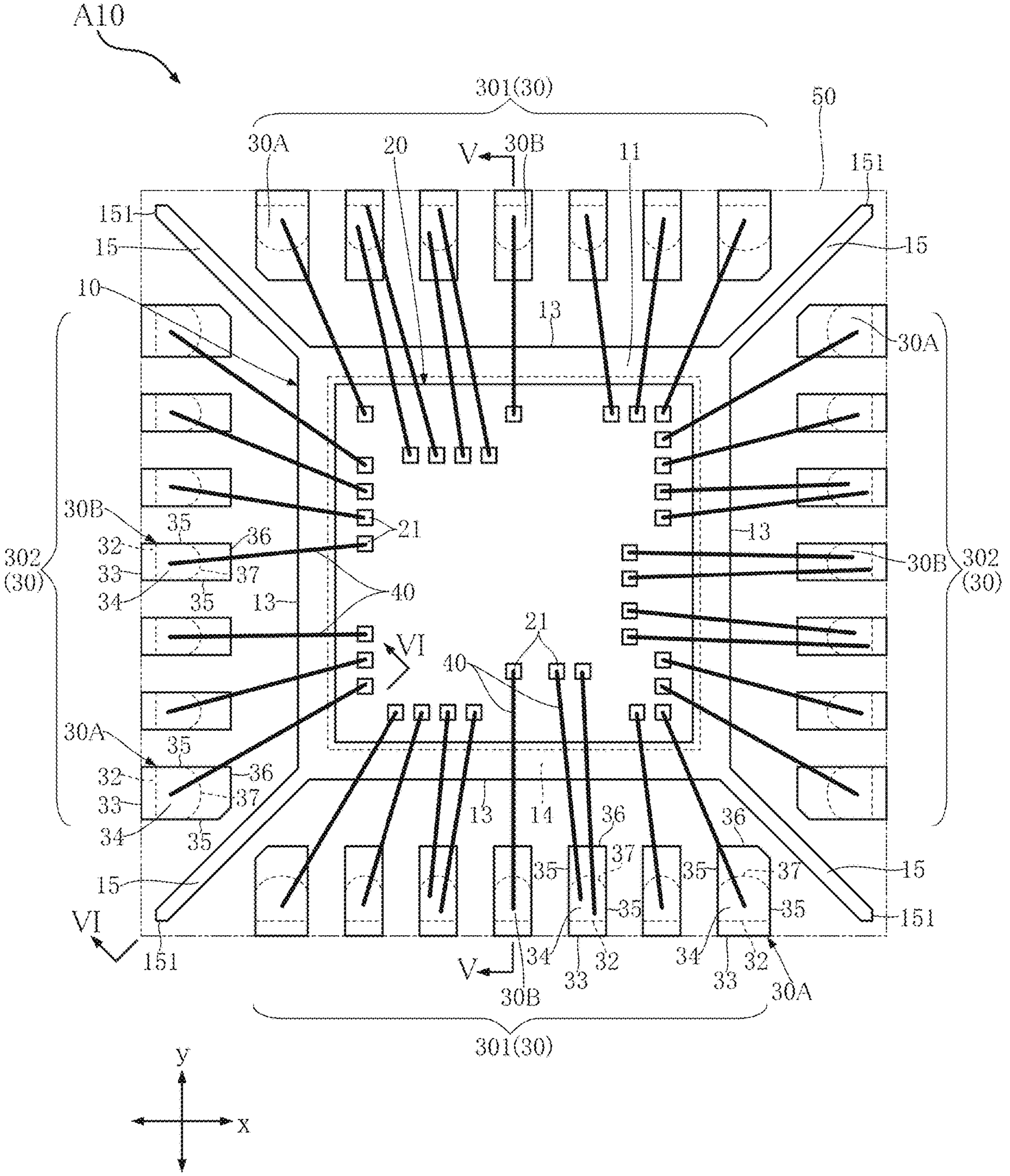
FIG. 1 is a plan view of a semiconductor device according to a first embodiment of the present disclosure as seen through a sealing resin.

A semiconductor device A10 according to a first embodiment of the present disclosure will be described based on FIGS. 1 to 9. The semiconductor device A10 is surface-mounted on a circuit board of a variety of electronic devices. The package type of the semiconductor device A10 is the QFN (Quad Flat Non-leaded package). The semiconductor device A10 includes a die pad 10, a semiconductor element 20, a plurality of terminals 30, plurality of wires 40, and a sealing resin 50. For the convenience of understanding, the sealing resin 50 is transparent in FIG. 1. In FIG. 1, the outlines of the sealing resin 50 are indicated by imaginary lines (dash-double dot lines). In FIGS. 2 to 4, 8 and 9, a coating layer 60 is shown as dotted regions.

In the description of the semiconductor device A10, the thickness direction of each terminal 30 (or the die pad 10, the semiconductor element, etc.) is referred to as the "thickness direction z". A direction orthogonal to the thickness direction z is referred to as the "first direction x". A direction orthogonal to the thickness direction z and the first direction x is referred to as the "second direction y".

Figure 3:
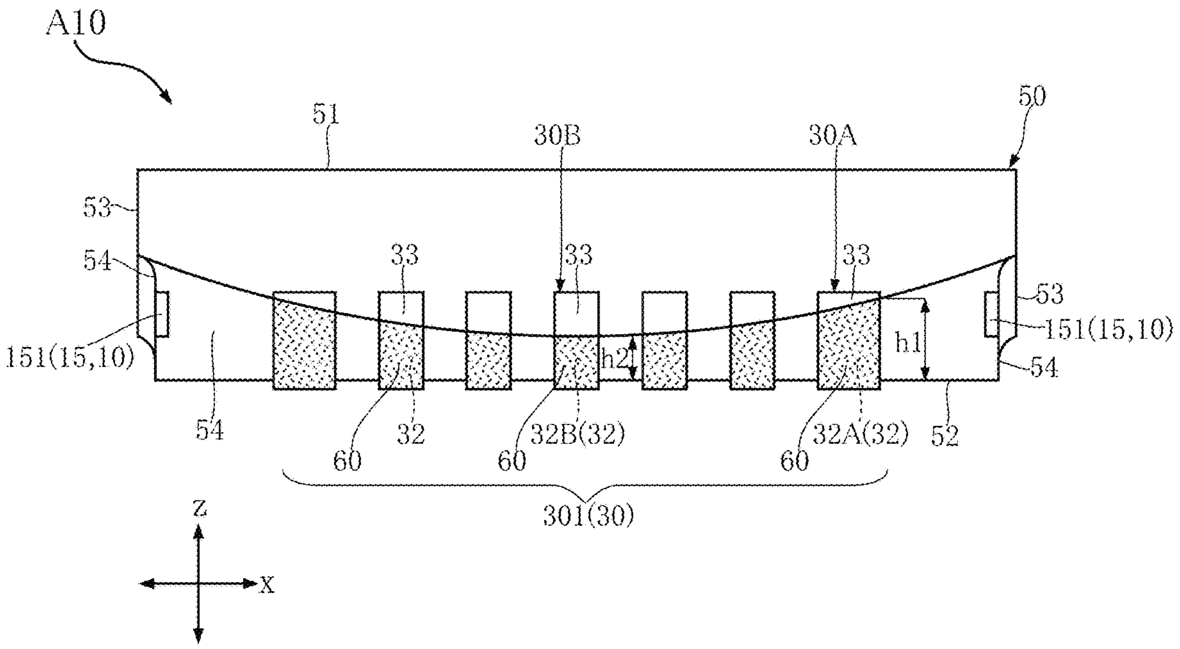
FIG. 3 is a front view of the semiconductor device shown in FIG. 1.
Figure 4:
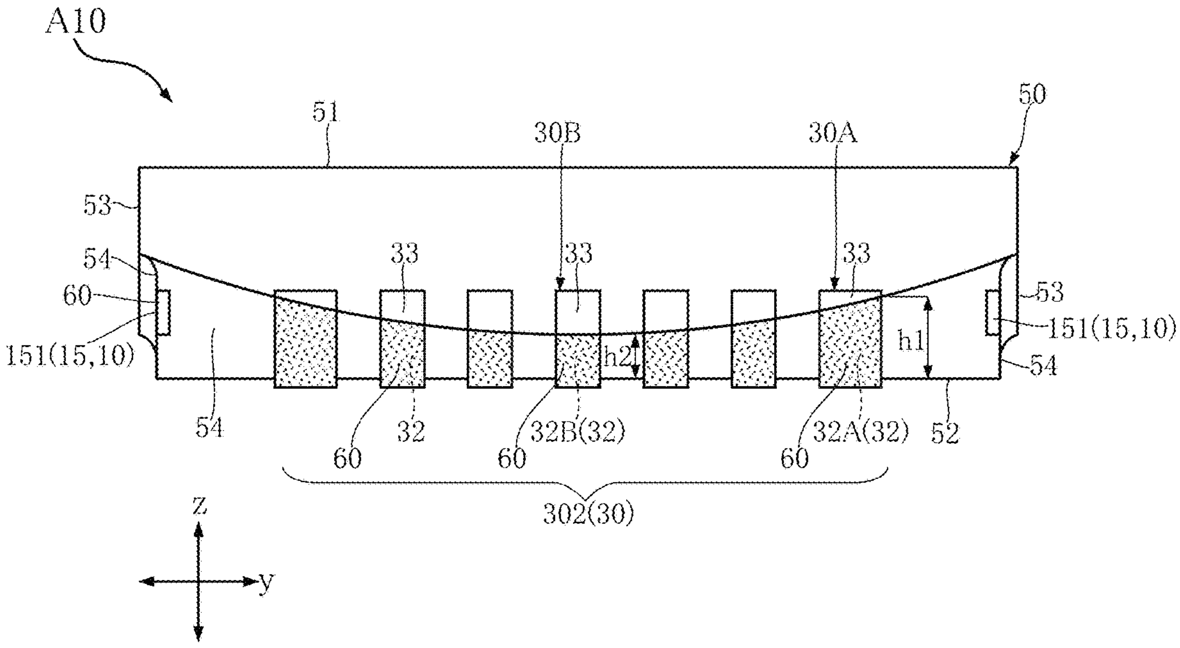
FIG. 4 is a left side view of the semiconductor device shown in FIG. 1.
Figure 5:
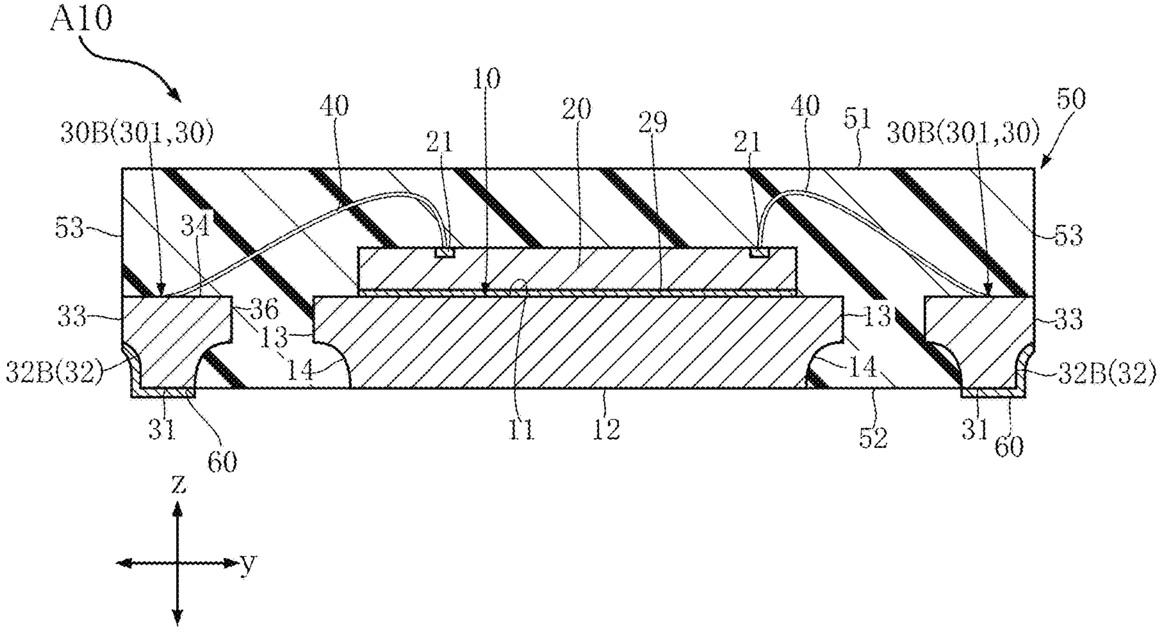
FIG. 5 is a sectional view taken along line V-V in FIG. 1.

As shown in FIG. 5, the sealing resin 50 covers the semiconductor element 20, and a part of the die pad 10 and each terminal 30. The sealing resin 50 is electrically insulating. The sealing resin 50 includes, for example, a black epoxy resin. As shown in FIGS. 3 and 4, the sealing resin 50 has a top surface 51, a bottom surface 52, a first side surface 53, and a second side surface 54.

As shown in FIGS. 3 to 5, the top surface 51 faces one side in the thickness direction z. As shown in FIGS. 2 to 5, the bottom surface 52 faces away from the top surface 51 in the thickness direction z.

As shown in FIGS. 2 to 6, the first side surface 53 faces in a direction orthogonal to the thickness direction z and is connected to the top surface 51. In the illustrated example, the first side surface 53 includes two regions facing in the first direction x (more precisely, two regions facing mutually opposite sides in the first direction x; the same applies hereinafter), and two regions facing in the second direction y. As shown in FIGS. 2 to 4 and 6, the second side surface 54 faces in a direction orthogonal to the thickness direction z and is connected to the bottom surface 52 and the first side surface 53. The second side surface 54 includes two regions facing in the first direction x and two regions facing in the second direction y. As viewed in the thickness direction z, the second side surface 54 is located inward of the sealing resin 50 (toward the semiconductor element 20) from the first side surface 53. As shown in FIGS. 3 and 4, the boundary between the first side surface 53 and the second side surface 54 of the sealing resin 50 overlaps with an arc that is convex toward the bottom surface 52, as viewed in each of the second direction y and the first direction x.

Figure 2:
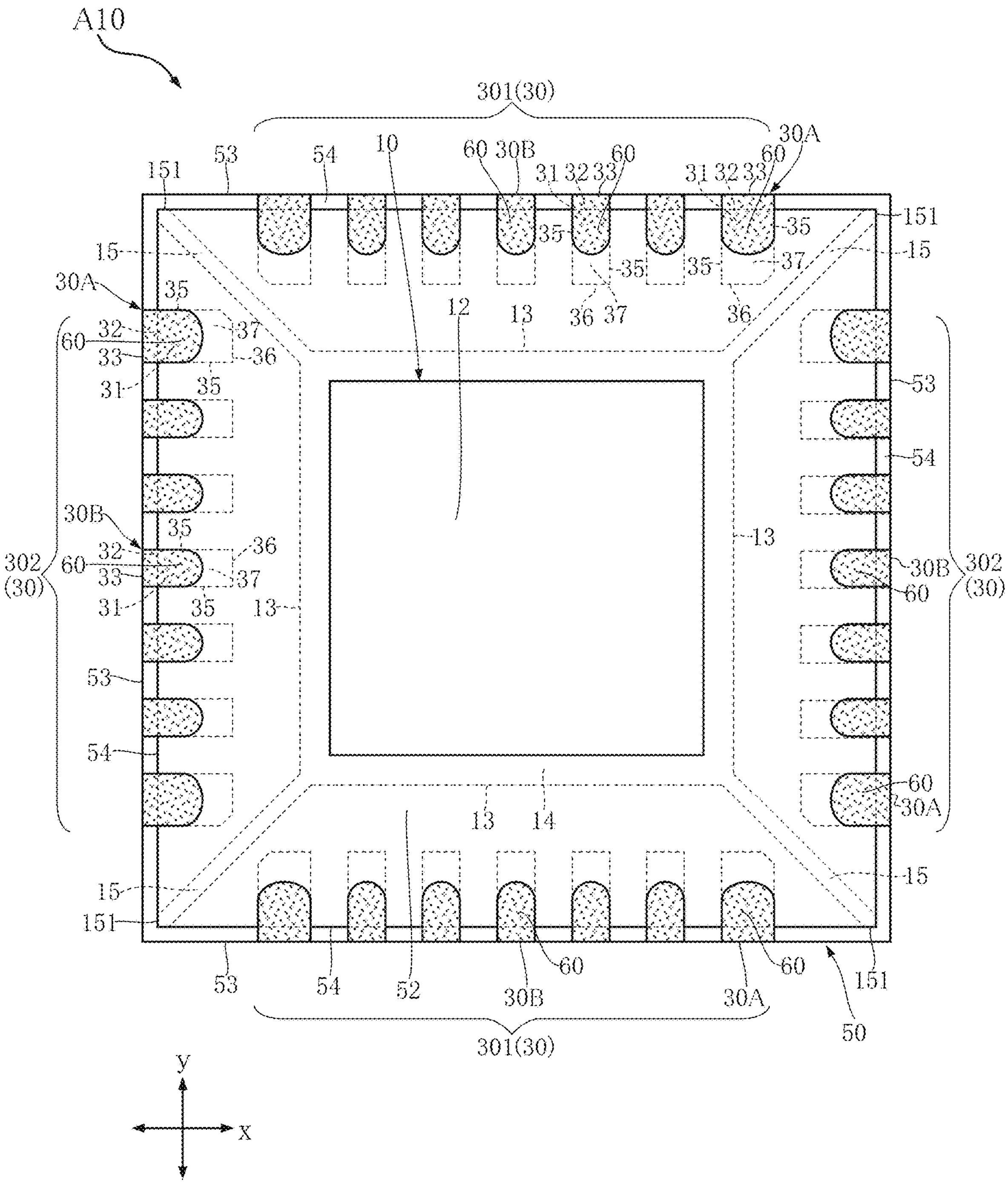
FIG. 2 is a bottom view of the semiconductor device shown in FIG. 1.

As shown in FIGS. 1 and 5, the die pad 10 is spaced apart from the terminals 30. The die pad 10 contains a metal element. The metal element is, for example, copper (Cu). The die pad 10 and the terminals 30 are obtained from the same lead frame. As shown in FIGS. 1 and 2, the die pad 10 includes a mount surface 11, a reverse surface 12, a peripheral surface 13, a peripheral groove 14, and a plurality of suspended portions 15.

As shown in FIG. 5, the mount surface 11 faces the same side as the top surface 51 of the sealing resin 50 in the thickness direction z. The mount surface 11 faces the semiconductor element 20. As shown in FIG. 5, the reverse surface 12 faces away from the mount surface 11 in the thickness direction z. The reverse surface 12 is exposed from the bottom surface 52 of the sealing resin 50. The area of the reverse surface 12 is smaller than the area of the mount surface 11.

As shown in FIGS. 1, 2 and 5, the peripheral surface 13 faces in a direction orthogonal to the thickness direction z and is connected to the mount surface 11. As viewed in the thickness direction z, the peripheral surface 13 surrounds the reverse surface 12. As shown in FIGS. 1 and 5, the peripheral groove 14 is recessed from the reverse surface 12 and the peripheral surface 13 toward the inside of the die pad 10. As viewed in the thickness direction z, the peripheral groove 14 surrounds the reverse surface 12. The peripheral groove 14 is in contact with the sealing resin 50.

Figure 6:
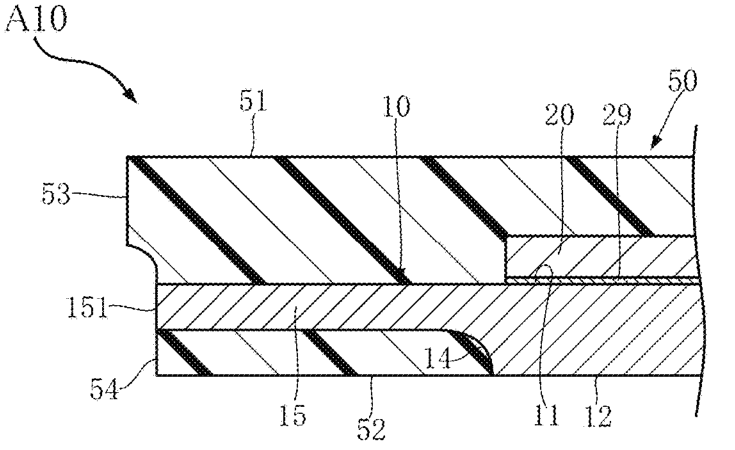
FIG. 6 is a sectional view taken along line VI-VI in FIG. 1.

As shown in FIG. 1, the suspended portions 15 extend radially from the four corners of the mount surface 11 as viewed in the thickness direction z. As shown in FIG. 6, each suspended portion 15 is flush with the mount surface 11. The suspended portions 15 are used to connect the die pad 10 to a lead frame. The dimension in the thickness direction z of each suspended portion 15 is smaller than the distance from the mount surface 11 to the reverse surface 12 in the thickness direction z. As shown in FIG. 1, each suspended portion 15 has an end surface 151, and the end surface 151 faces in the first direction x and the second direction y. More precisely, each end surface 151 includes a region facing in the first direction x and a region facing in the second direction y. Each end surface 151 is exposed from the second side surface 54 of the sealing resin 50 (see FIGS. 3 and 4).

As shown in FIGS. 1 and 5, the semiconductor element 20 is mounted on the mount surface 11 of the die pad 10. In the present embodiment, the semiconductor element 20 is an integrated circuit (IC) formed with, for example, a drive circuit for lighting a light source, such as an LED. The semiconductor element 20 has a plurality of electrodes 21.

As shown in FIG. 5, the electrodes 21 are provided on the above-mentioned one side in the thickness direction z of the semiconductor element 20. The electrodes 21 are electrically connected to the circuit formed in the semiconductor element 20. The composition of the electrodes 21 include aluminum (Al), for example. As shown in FIG. 1, each electrode 21 is connected to at least one of the terminals 30.

As shown in FIG. 5, a bonding layer 29 is interposed between the mount surface 11 of the die pad 10 and the semiconductor element 20. The bonding layer 29 is made of, for example, a paste (so-called Ag paste) mainly composed of epoxy resin mixed with silver. The semiconductor element 20 is bonded to the mount surface 11 via the bonding layer 29.

As shown in FIGS. 1 and 2, the plurality of terminals 30 include two first terminal groups 301 and two second terminal groups 302. The two first terminal groups 301 are spaced apart from each other in the second direction y, and the terminals 30 belonging to each terminal group are arranged along the first direction x. The two second terminal groups 302 are spaced apart from each other in the first direction x, and the terminals 30 belonging to each terminal group are arranged along the second direction y. Each of the two first terminal groups 301 and two second terminal groups 302 includes one first terminal 30A and one second terminal 30B. The arrangement or configuration of the terminals 30 is the same in all of these groups. Thus, the arrangement or configuration of the terminals 30 will be hereinafter described by using either one of the two first terminal groups 301 as a representative example.

Figure 7:
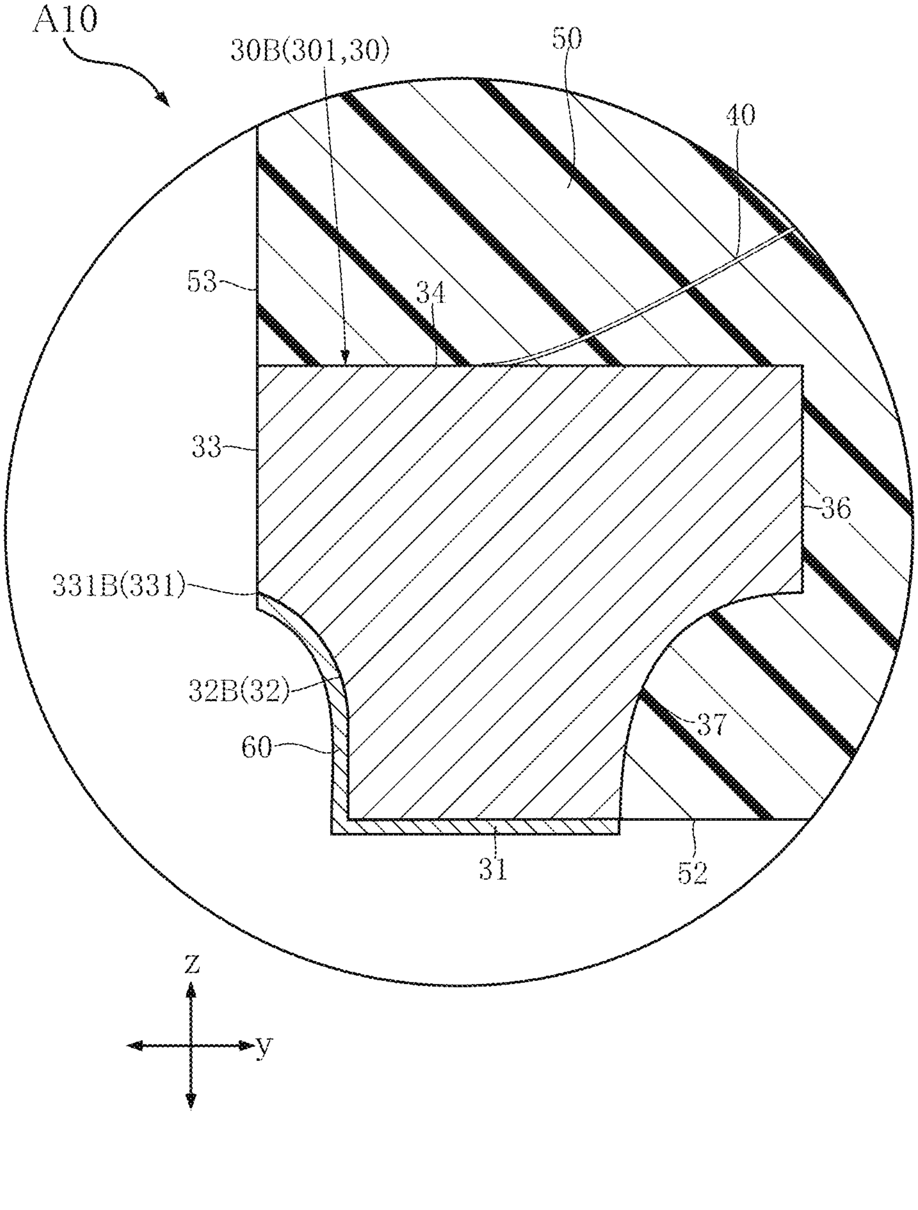
FIG. 7 is a partial enlarged view of FIG. 5.

As shown in FIG. 3, the first terminal 30A is located closest to one end in the first direction x of the sealing resin 50. The second terminal 30B is spaced apart from the first terminal 30A. In the semiconductor device A10, the second terminal 30B is located closest to the center in the first direction x of the sealing resin 50. As shown in FIGS. 1, 2 and 7, each of the terminals 30 has a mount surface 31, a side surface 32, an end surface 33, a connecting surface 34, an inner side surface 35, an inner end surface 36, and a curved surface 37.

As shown in FIGS. 2 and 7, the mount surface 31 faces the same side as the reverse surface 12 of the die pad 10 in the thickness direction z. The mount surface 31 is exposed from the bottom surface 52 of the sealing resin 50. When the semiconductor device A10 is mounted on a circuit board, the mount surface 31 faces the circuit board.

As shown in FIGS. 2, 3 and 7, the side surface 32 faces in the second direction y and is connected to the mount surface 31. The side surface 32 is exposed from the second side surface 54 of the sealing resin 50.

As shown in FIG. 3, the side surfaces 32 of the plurality of terminals 30 include a first side surface 32A and a second side surface 32B. The first side surface 32A corresponds to the side surface 32 of the first terminal 30A. The second side surface 32B corresponds to the side surface 32 of the second terminal 30B. The second dimension h2 of the second side surface 32B in the thickness direction z differs from the first dimension h1 of the first side surface 32A in the thickness direction z. Here, the first dimension h1 is the maximum dimension of the first side surface 32A in the thickness direction z. The second dimension h2 is the maximum dimension of the second side surface 32B in the thickness direction z. In the semiconductor device A10, the second dimension h2 is smaller than the first dimension h1. Also, in the semiconductor device A10, the first dimension h1 is the largest among the dimensions in the thickness direction of the side surfaces 32 of the plurality of terminals 30.

As shown in FIG. 3, in the semiconductor device A10, the side surfaces 32 of the terminals 30 located between the first terminal 30A and the second terminal 30B each have a dimension in the thickness direction z that is smaller than the first dimension h1 and larger than the second dimension h2. In the plurality of terminals 30, the dimensions in the thickness direction z of the side surfaces 32 gradually become smaller from the first terminal 30A toward the second terminal 30B.

Figure 8:
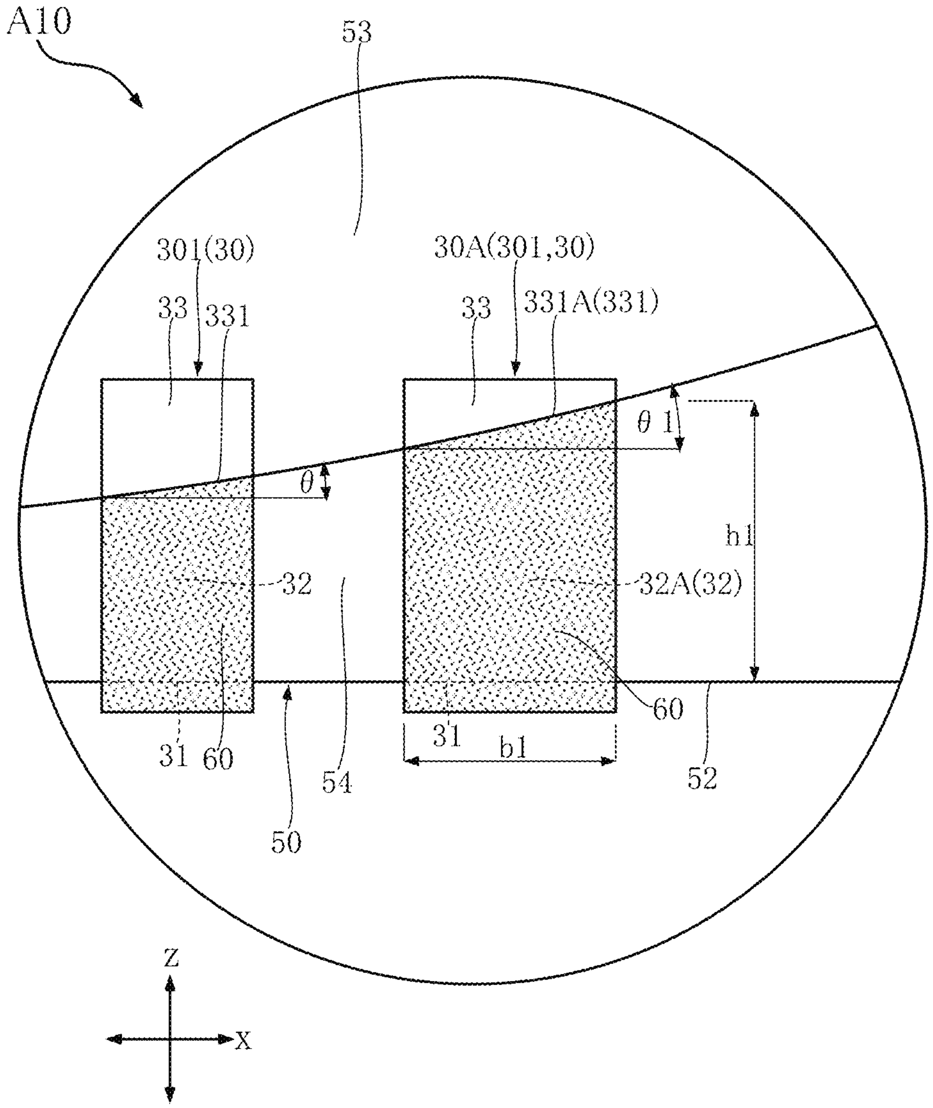
FIG. 8 is a partial enlarged view of the first terminal shown in FIG. 3 and a nearby portion.
Figure 9:
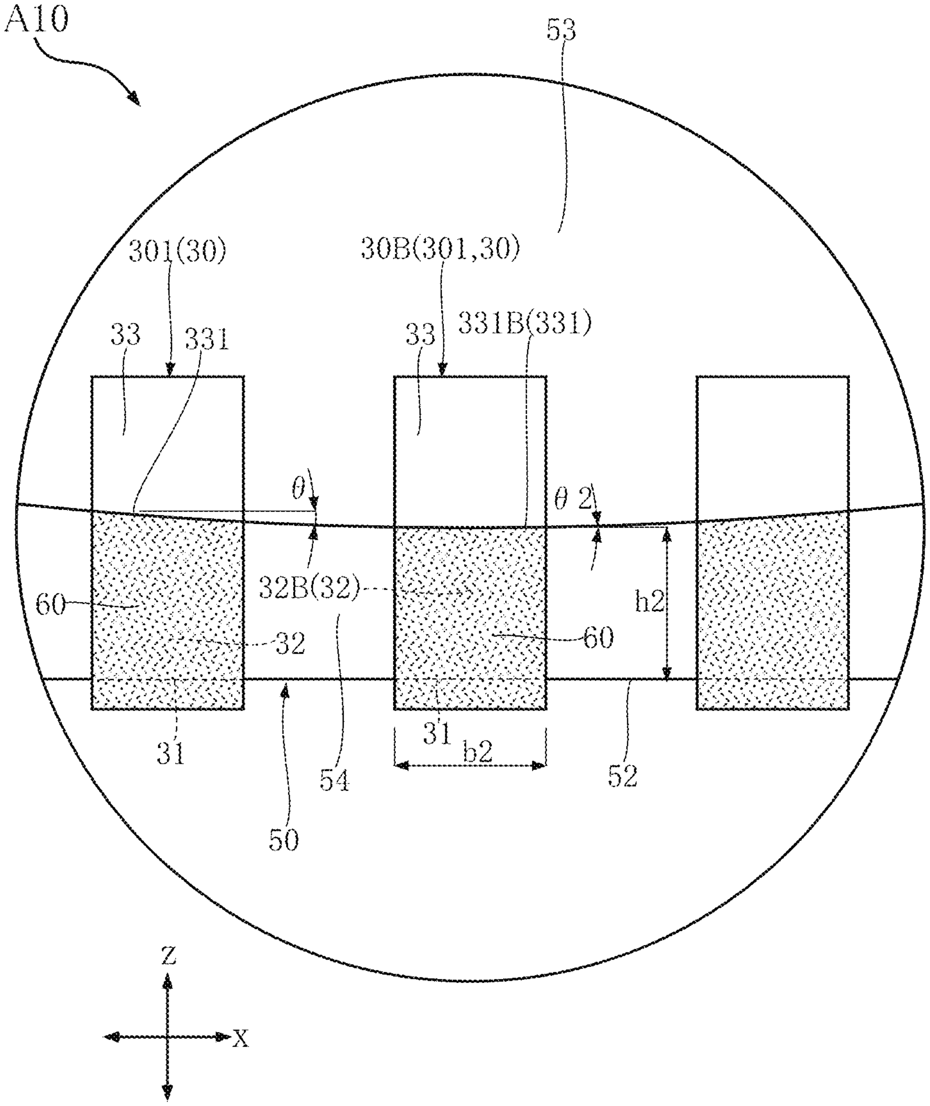
FIG. 9 is a partial enlarged view of the second terminal shown in FIG. 3 and a nearby portion.

As shown in FIGS. 8 and 9, the dimension b1 of the first side surface 32A in the first direction x is larger than the dimension b2 of the second side surface 32B in the first direction x.

As shown in FIG. 7, the end surface 33 faces in the second direction y and is connected to the side surface 32. The end surface 33 is located opposite to the mount surface 31 with respect to the side surface 32 in each of the thickness direction z and the second direction y. The end surface 33 is exposed from the first side surface 53 of the sealing resin 50.

As shown in FIGS. 8 and 9, each of the terminals 30 has a boundary 331 between the side surface 32 and the end surface 33. The boundaries 331 of the plurality of terminals 30 include a first boundary 331A and a second boundary 331B. The first boundary 331A is the boundary 331 that the first terminal 30A has. The second boundary 331B is the boundary 331 that the second terminal 30B has. The first boundary 331A is inclined with respect to the first direction x. The second boundary 331B is inclined with respect to the first direction x. The inclination angle θ2 (FIG. 9) of the second boundary 331B with respect to the first direction x is smaller than the inclination angle θ1 (FIG. 8) of the first boundary 331A with respect to the first direction x. The inclination angle θ1 of the first boundary 331A with respect to the first direction x is the largest among the inclination angles θ of the boundaries 331 of the plurality of terminals 30 with respect to the first direction x. As viewed in the second direction y, the boundaries 331 of the terminals 30 overlap with an arc that is convex toward the bottom surface 52 of the sealing resin 50. Thus, the inclination angles θ (including the inclination angles θ1 and 02) each are given, for example, as the maximum acute angle of the intersection angles between a line extending along the first direction x and a tangent line to the boundary 331. Alternatively, the inclination angle θ related to each terminal may be the minimum (or an intermediate) acute angle of the intersection angles between a line extending along the first direction X and a tangent line to the boundary 331.

As shown in FIGS. 1 and 7, the connecting surface 34 faces away from the mount surface 31 in the thickness direction z. The connecting surface 34 is connected to the end surface 33. The area of the connecting surface 34 is larger than the area of the mount surface 31.

As shown in FIGS. 1 and 2, the inner side surface 35 faces in the first direction x and is connected to the mount surface 31 and the connecting surface 34. The inner side surface 35 includes two regions spaced apart from each other in the first direction x. The inner side surface 35 is in contact with the sealing resin 50.

As shown in FIGS. 1, 2 and 7, the inner end surface 36 faces away from the end surface 33 in the second direction y. The inner end surface 36 is connected to the connecting surface 34 and the inner side surface 35. The areas of the inner end surfaces 36 of the plurality of terminals 30 are equal to each other. The inner end surface 36 is in contact with the sealing resin 50.

As shown in FIGS. 1, 2 and 7, the curved surface 37 is connected to the mount surface 31, the inner side surface 35 and the inner end surface 36, and curved toward the inside of the terminal 30. The curved surface 37 overlaps with the connecting surface 34 as viewed in the thickness direction z. The curved surface 37 is in contact with the sealing resin 50.

As shown in FIGS. 1 and 5, each of the wires 40 is connected to one of the electrodes 21 of the semiconductor element 20 and one of the connecting surfaces 34 of the terminals 30. Thus, the semiconductor element 20 is electrically connected to at least one of the terminals 30. The composition of the wires 40 includes gold (Au), for example.

As shown in FIGS. 2 to 5, the coating layer 60 covers the mount surfaces 31 and the side surfaces 32 of the terminals 30. The coating layer 60 contains a metal element. The metal element is, for example, tin (Sn).

An example of a method for manufacturing the semiconductor device A10 will be described based on FIGS. 10 to 13. FIGS. 10 to 13 are sectional views taken along the same plane as FIG. 5.

Figure 10:
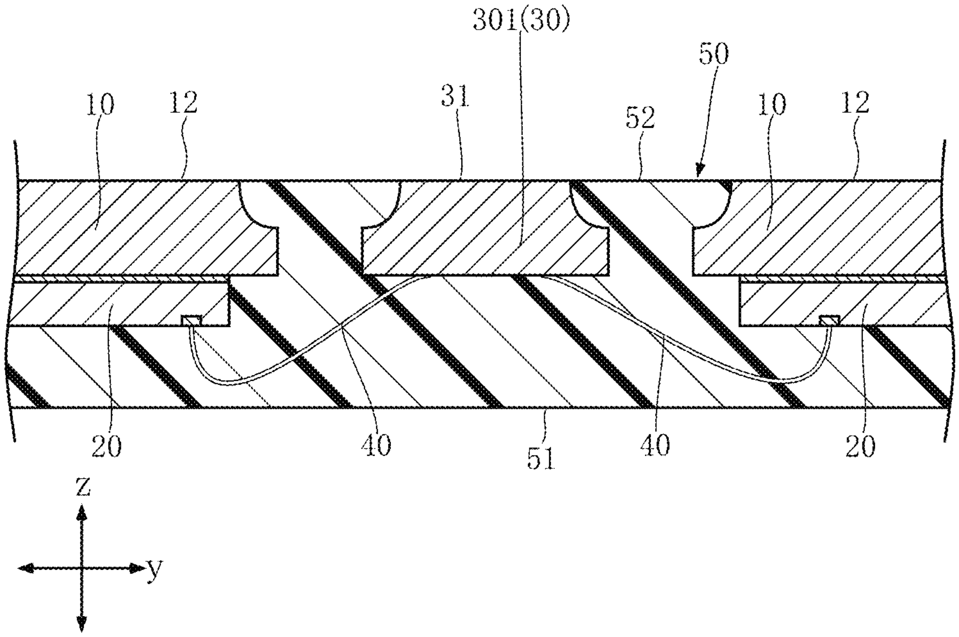
FIG. 10 is a sectional view for describing a manufacturing step of the semiconductor device shown in FIG. 1.

First, a sealing resin 50 that covers the semiconductor elements 20 and a part of each of the die pads 10 and the terminals 30 is formed as shown in FIG. 10. The sealing resin 50 is formed by compression molding. The reverse surfaces 12 of the die pads 10 and the mount surfaces 31 of the terminals 30 are exposed from the bottom surface 52 of the sealing resin 50.

Figure 11:
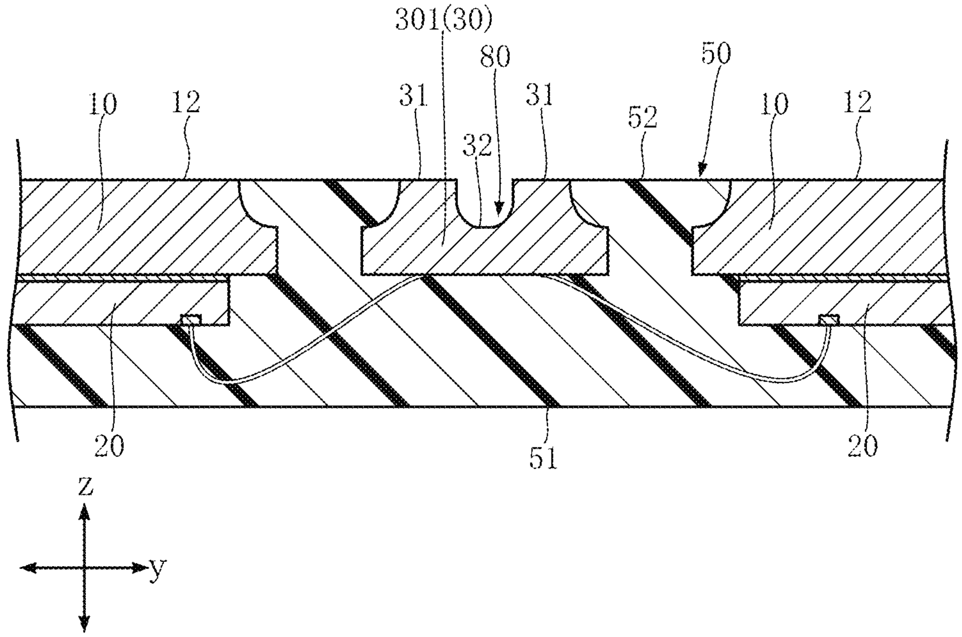
FIG. 11 is sectional view for describing a manufacturing step of the semiconductor device shown in FIG. 1.

Next, a plurality of grooves 80 each recessed from the mount surface 31 and the bottom surface 52 in the thickness direction z are formed in the terminals 30 and the sealing resin 50, as shown in FIG. 11. Each of the grooves 80 extends in the first direction x or the second direction y, so that the plurality of grooves 80 form a grid pattern as viewed in the thickness direction z. The grooves 80 are formed using a dicing blade. Through this process, a side surface 32 is formed in each of the terminals 30. When forming each groove 80, the position of the dicing blade in the thickness direction z relative to the sealing resin 50 is adjusted as appropriate. This results in the side surfaces 32 of the terminals 30 having different dimensions in the thickness direction z.

Figure 12:
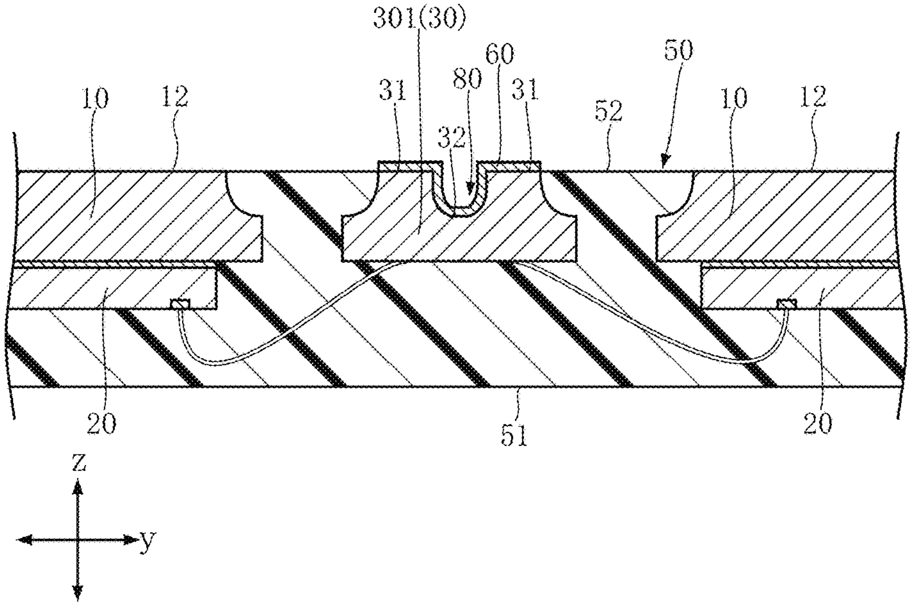
FIG. 12 is a sectional view for describing a manufacturing step of the semiconductor device shown in FIG. 1.

Next, a coating layer 60 that covers the mount surfaces 31 and side surfaces 32 of the terminals 30 are formed, as shown in FIG. 12. The coating layer 60 is formed by electrolytic plating using as the conduction path the lead frame to which the terminals 30 are connected.

Figure 13:
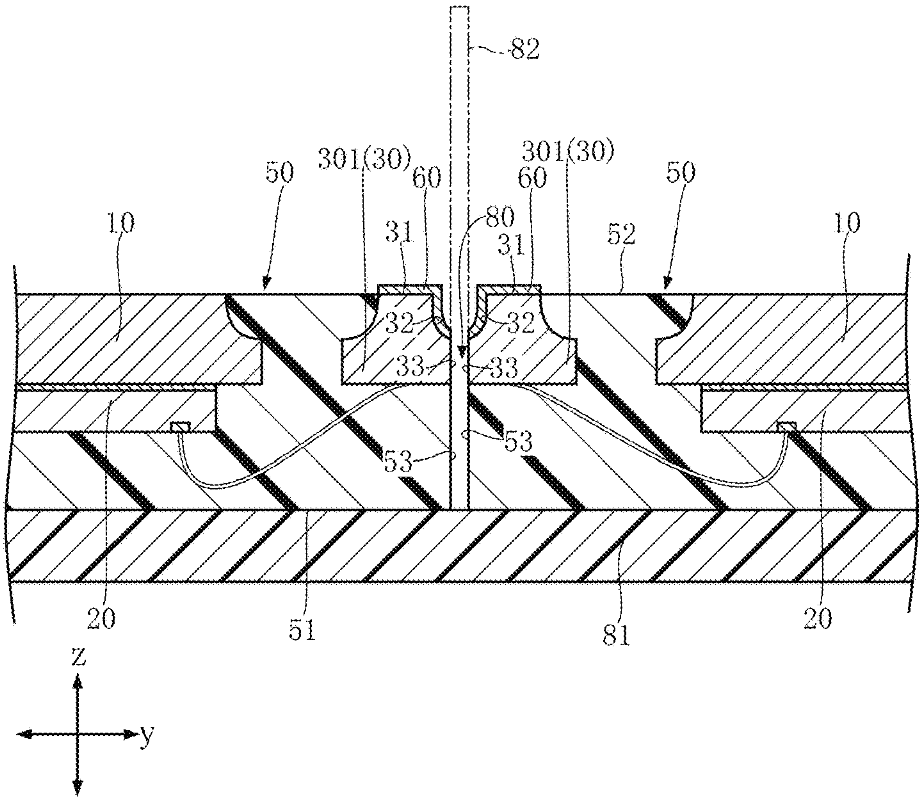
FIG. 13 is a sectional view for describing a manufacturing step of the semiconductor device shown in FIG. 1.

Finally, after a tape 81 is attached to the top surface 51 of the sealing resin 50, the terminals 30 and the sealing resin 50 are cut along the grooves 80 with a blade 82, as shown in FIG. 13. The width of the blade 82 is smaller than that of each groove 80. Through this process, an end surface 33 is formed in each of the terminals 30. By the above process, the semiconductor device A10 is obtained.

Next, the effects of the semiconductor device A10 will be described.

The semiconductor device A10 includes terminals 30 arranged along the first direction x. Each of the terminals 30 has the mount surface 31 and the side surface 32. The mount surface 31 and the side surface 32 are exposed from the sealing resin 50. The plurality of terminals 30 include the first terminal 30A located closest to one end in the first direction x of the sealing resin 50 and the second terminal 30B spaced apart from the first terminal 30A. The side surfaces 32 of the terminals 30 include the first side surface 32A of the first terminal 30A and the second side surface 32B of the second terminal 30B. The second dimension h2 of the second side surface 32B in the thickness direction z differs from the first dimension h1 of the first side surface 32A in the thickness direction z. Thus, when the semiconductor device A10 is mounted on a circuit board, the height of the solder fillet formed on the second side surface 32B differs from the height of the solder fillet formed on the first side surface 32A. This is because the height of a solder fillet depends on the dimension in the thickness direction z of the side surface 32 of the terminal 30. Thus, the semiconductor device A10 is capable of having solder fillets of different heights formed on the terminals 30 when the semiconductor device A10 is mounted on a circuit board.

In the semiconductor device A10, the second terminal 30B is located closest to the center in the first direction x of the sealing resin 50. (This includes the case where the distance from the center is zero.) Also, the second dimension h2 of the second side surface 32B is smaller than the first dimension h1 of the first side surface 32A. Therefore, the height of the solder fillet on the first side surface 32A can be made larger than the height of the solder fillet on the second side surface 32B. During the use of the semiconductor device A10, thermal stress is exerted on the terminals 30 because of the heat generated from the semiconductor element 20. The thermal stress tends to concentrate on the first terminal 30A of the plurality of terminals 30. The present configuration allows the volume of the solder fillet formed on the first terminal 30A to be larger than the volume of the solder fillet formed on the second terminal 30B. Therefore, the thermal stress on the first terminal 30A can be dissipated to the solder fillet having a relatively large volume, and the concentration of thermal stress on the first terminal 30A can be reduced.

In the semiconductor device A10, the first dimension h1 of the first side surface 32A is the largest among the dimensions in the thickness direction z of the side surfaces 32 of the terminals 30. This allows the volume of the solder fillet formed on the first terminal 30A to be the largest among the volumes of the solder fillets formed on the plurality of terminals 30. Therefore, the concentration of thermal stress on the first terminal 30A can be effectively reduced. In this case, the volume of the solder fillet formed on the first terminal 30A can be further increased by making the dimension b1 in the first direction x of the first side surface 32A (see FIG. 8) larger than the dimension b2 in the first direction x of the second side surface 32B (see FIG. 9).

The semiconductor device A10 further includes the coating layer 60 that covers the mount surfaces 31 and side surfaces 32 of the terminals 30. The coating layer 60 contains a metal element. Such a configuration improves wettability of solder to the terminals 30 when the semiconductor device A10 is mounted on a wiring board.

Each of the terminals 30 has the end surface 33 facing in the second direction y and exposed from the sealing resin 50. The end surface 33 is located opposite to the mount surface 31 with respect to the side surface 32 in each of the thickness direction z and the second direction y. The end surface 33 is connected to the side surface 32. That is, when the side surfaces 32 are formed in the terminals 30 in the step shown in FIG. 11 of the manufacturing process of the semiconductor device A10, the terminals 30 remain connected to the lead frame. Therefore, in the step shown in FIG. 12 of the manufacturing process of the semiconductor device A10, it is possible to form the coating layer 60 by electrolytic plating using the lead frame as the conduction path.

Each of the terminals 30 has a connecting surface 34 and a curved surface 37. The area of the connecting surface 34 is larger than the area of the mount surface 31. The curved surface 37 overlaps with the connecting surface 34 as viewed in the thickness direction z, and overlaps with the mount surface 31 as well. The curved surface 37 is in contact with the sealing resin 50. Therefore, when the terminals 30 are urged to fall off the bottom surface 52 of the sealing resin 50, the sealing resin 50 interferes with the curved surface 37, whereby the terminals 30 are prevented from falling off.

The semiconductor device A10 further includes the die pad 10 spaced apart from the terminals 30. The semiconductor element 20 is mounted on the die pad 10. The die pad 10 has the reverse surface 12 exposed from the sealing resin 50. This improves the heat dissipation of the semiconductor device A10. The die pad 10 is formed with the peripheral groove 14 recessed from the reverse surface 12 and the peripheral surface 13 toward the inside of the die pad 10. The peripheral groove 14 is in contact with the sealing resin 50. Therefore, when the die pad 10 is urged to fall off the bottom 52 of the sealing resin 50, the sealing resin 50 interferes with the peripheral groove 14, whereby the die pad 10 is prevented from falling off.

Second Embodiment

Figure 14:
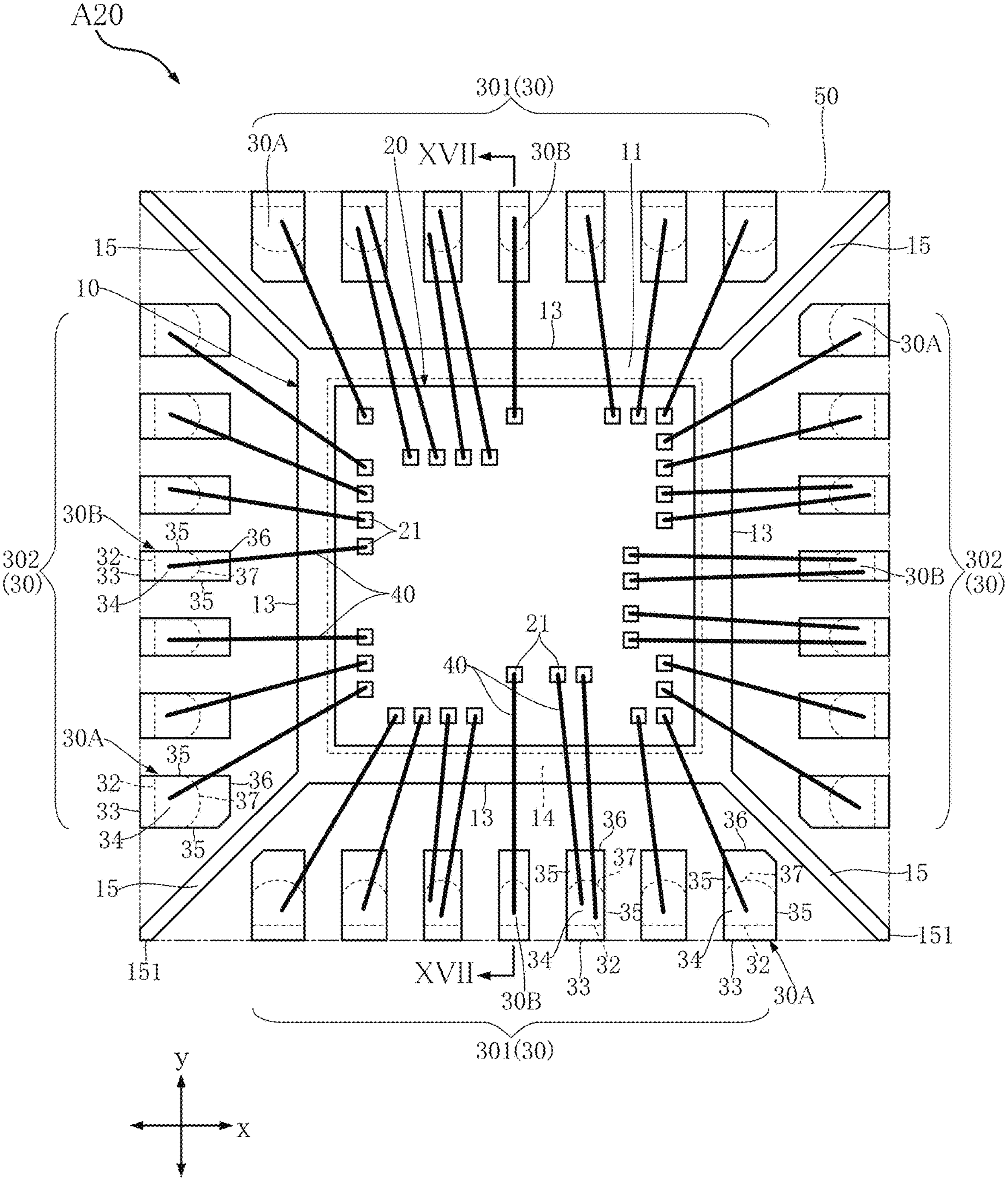
FIG. 14 is a plan view of a semiconductor device according to a second embodiment of the present disclosure as seen through the sealing resin.

A semiconductor according to a second embodiment of the present disclosure will be described based on FIGS. 14 to 19. In these figures, the elements that are identical or similar to those of the semiconductor device A10 described above are denoted by the same reference signs, and the descriptions thereof are omitted. For the convenience of understanding, the sealing resin 50 is transparent in FIG. 14. In FIG. 14, the outlines of the sealing resin 50 are indicated by imaginary lines. In FIGS. 15, 16, 18 and 19, the coating layer 60 is shown as dotted regions.

The semiconductor device A20 differs from the above-described semiconductor device A10 in configurations of the die pad 10 and terminals 30.

Figure 15:
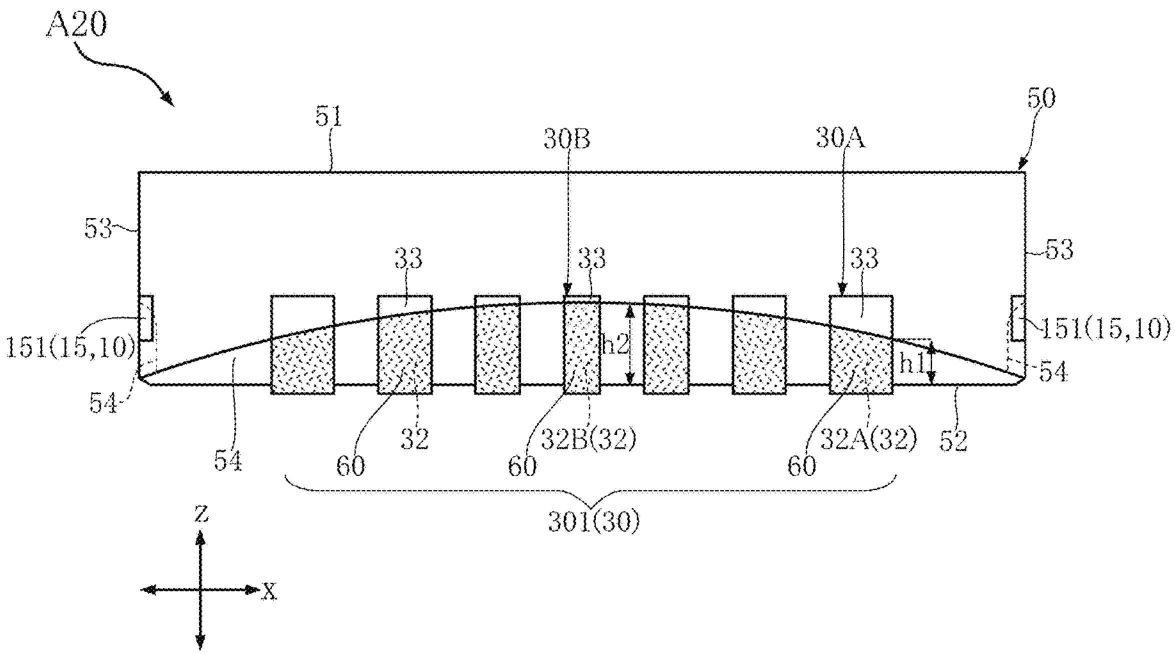
FIG. 15 is a front view of the semiconductor device shown in FIG. 14.
Figure 16:
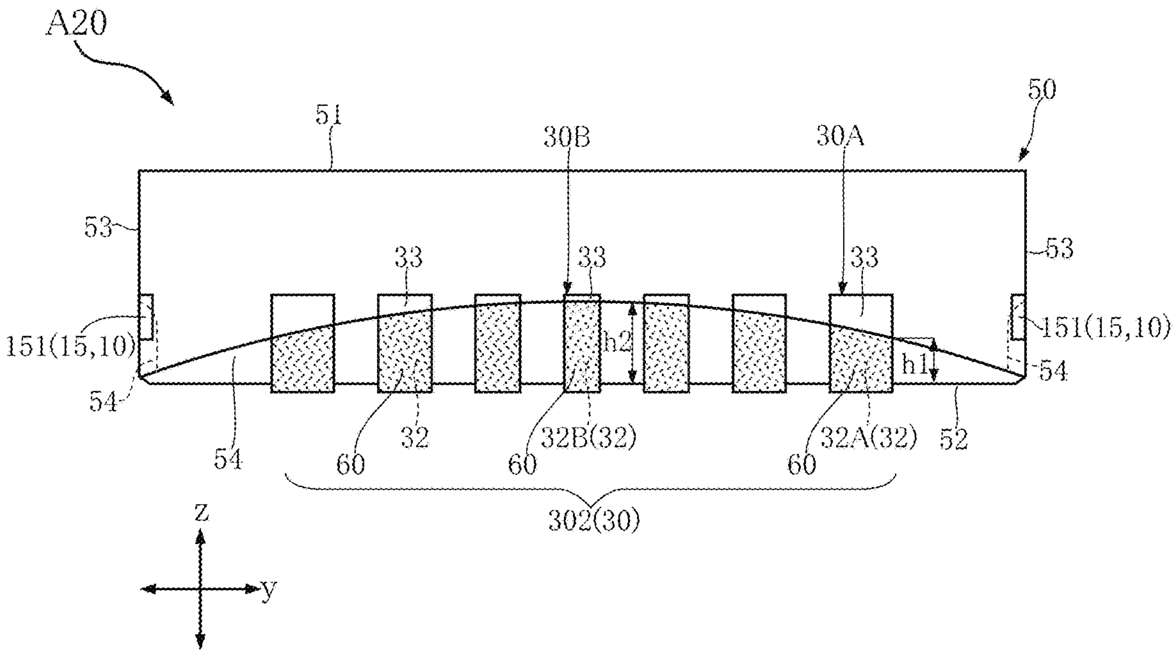
FIG. 16 is a left side view of the semiconductor device shown in FIG. 14.
Figure 17:
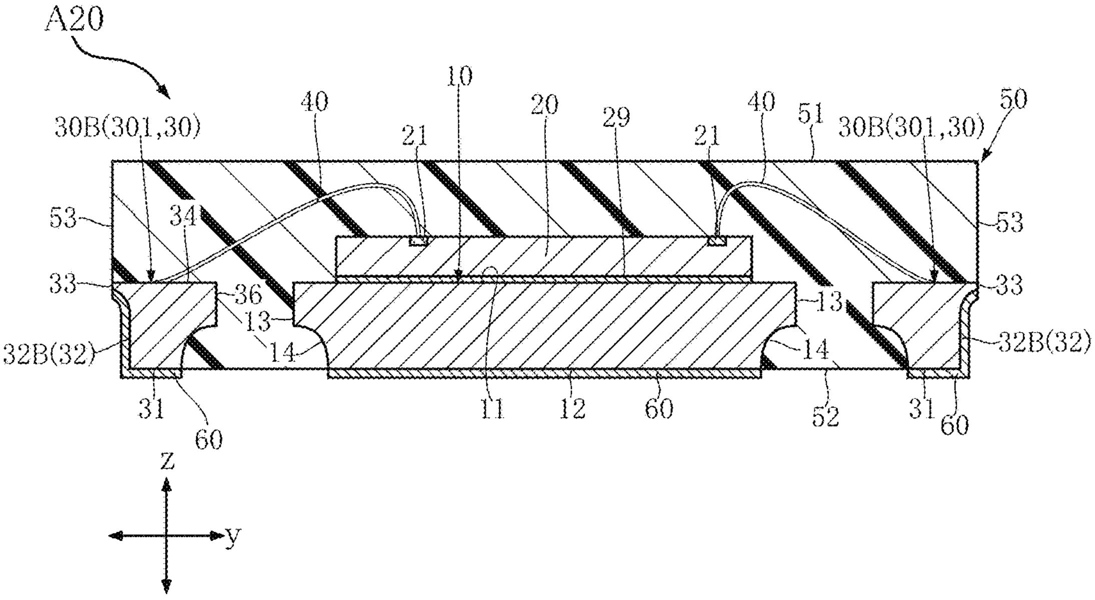
FIG. 17 is a sectional view taken along line XVII-XVII in FIG. 14.

As shown in FIGS. 15 and 16, the end surfaces 151 of the suspended portions 15 of the die pad 10 are uncovered and exposed from the first side surface 53. On the other hand, as shown in FIG. 17, the reverse surface 12 of the die pad 10 is covered with the coating layer 60. This difference is due to the following: the suspended portions 15 are integrally connected, as with the terminals 30, to the lead frame in the step shown in FIG. 11, while in the step shown in FIG. 12, a metal layer that will become the coating layer 60 is deposited on the reverse surface 12 by electrolytic plating.

As shown in FIGS. 14 to 16, in the semiconductor device A20 again, each of the two first terminal groups 301 and two second terminal groups 302, consisting of the terminals 30, includes the first terminal 30A and the second terminal 30B. The configurations of the first terminal 30A and the second terminal 30B are the same in all groups. Therefore, the configurations of the first terminal 30A and the second terminal 30B of the semiconductor device A20 will be described by using either one of the two first terminal groups 301 as a representative example.

Figure 18:
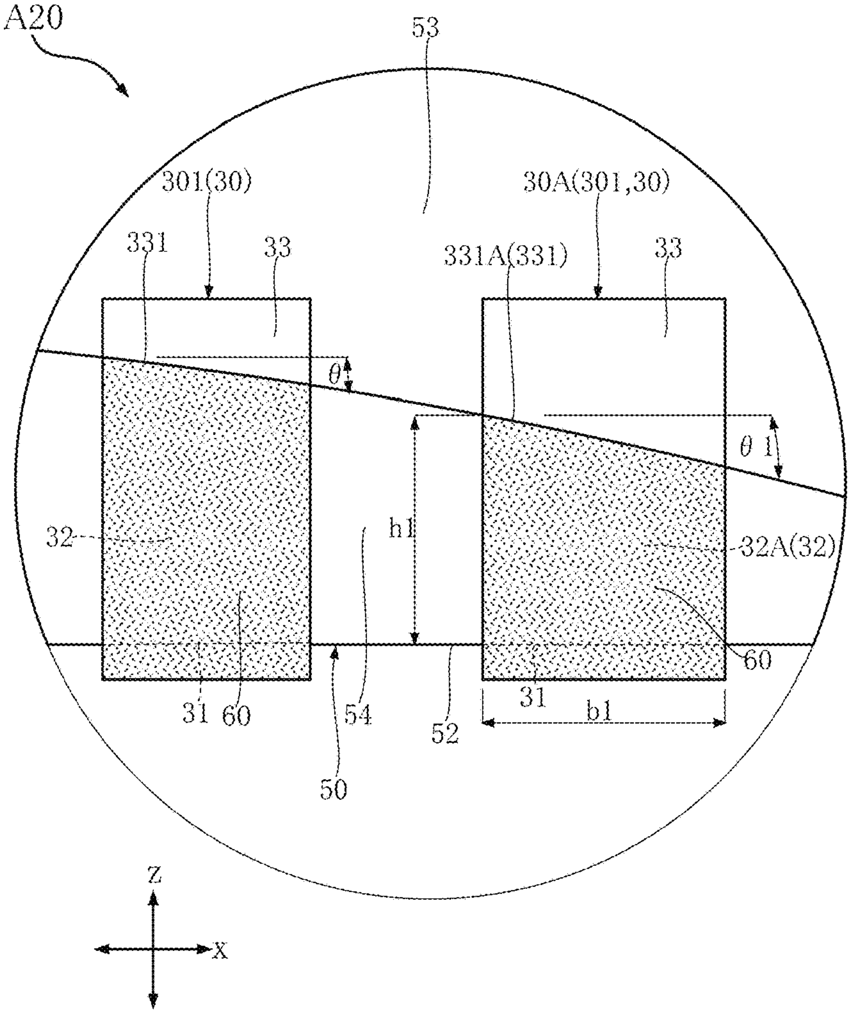
FIG. 18 is a partial enlarged view of the first terminal shown in FIG. 15 and a nearby portion.
Figure 19:
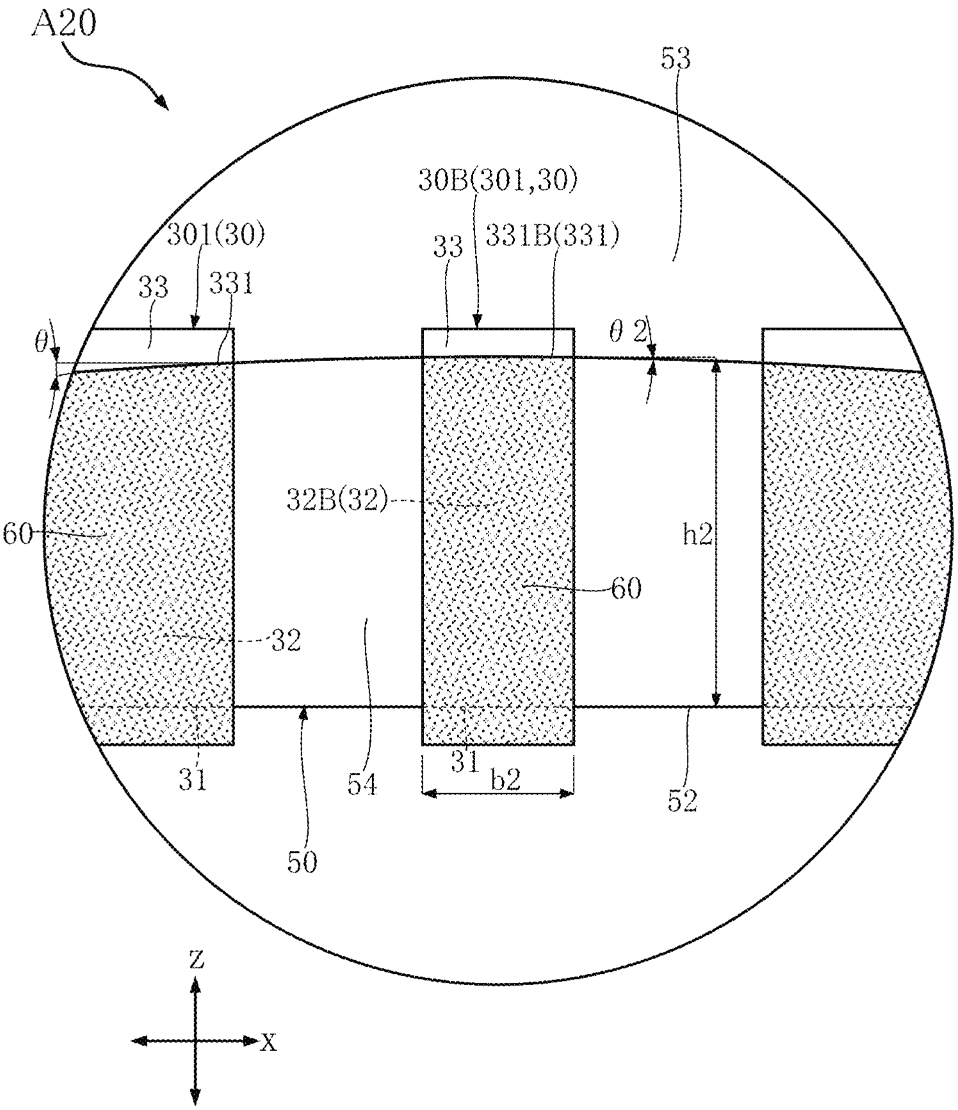
FIG. 19 is a partial enlarged view of the second terminal shown in FIG. 15 and a nearby portion.

As shown in FIGS. 14 and 15, the second terminal 30B is located closest to the center in the first direction x of the sealing resin 50. As shown in FIGS. 19 and 18, the second dimension h2 in the thickness direction z of the second side surface 32B of the second terminal 30B is larger than the first dimension h1 in the thickness direction z of the first side surface 32A of the first terminal 30A.

As shown in FIG. 15, in the semiconductor device A20, the side surfaces 32 of the terminals 30 located between the first terminal 30A and the second terminal 30B each have a dimension in the thickness direction z that is larger than the first dimension h1 and smaller than the second dimension h2. In the plurality of terminals 30, the dimensions in the thickness direction z of the side surfaces 32 gradually become larger from the first terminal 30A toward the second terminal 30B.

As shown in FIGS. 19 and 18, the dimension b2 of the second side surface 32B in the first direction x is smaller than the dimension b1 of the first side surface 32A in the first direction x.

As shown in FIGS. 15 and 16, the boundary between the first side surface 53 and the second side surface 54 of the sealing resin 50 overlaps with an arc that is convex toward the bottom surface 52 of the sealing resin 50, as viewed in each of the first direction x and the second direction y. Also, as shown in FIG. 15, the boundaries 331 in the terminals 30 overlap with an arc that is convex toward the top surface 51 of the sealing resin 50, as viewed in the second direction y. In this case again, the inclination angles θ including the inclination angles θ1 and θ2 each are given, for example, as the maximum acute angle of the intersection angles between a line extending along the first direction x and a tangent line to the boundary 331, but the present disclosure is not limited to this.

Next, the effects of the semiconductor device A20 will be described.

The semiconductor device A20 includes terminals 30 arranged along the first direction x. Each of the terminals 30 has the mount surface 31 and the side surface 32. The mount surface 31 and the side surface 32 are exposed from the sealing resin 50. The plurality of terminals 30 include the first terminal 30A located closest to one end in the first direction x of the sealing resin 50 and the second terminal 30B spaced apart from the first terminal 30A. The side surfaces 32 of the terminals 30 include the first side surface 32A of the first terminal 30A and the second side surface 32B of the second terminal 30B. The second dimension h2 of the second side surface 32B in the thickness direction z differs from the first dimension h1 of the first side surface 32A in the thickness direction z. Thus, the semiconductor device A20 is also capable of having solder fillets of different heights formed on the terminals 30 when the semiconductor device A20 is mounted on a circuit board.

In the semiconductor device A20, the second terminal 30B is located closest to the center in the first direction x of the sealing resin 50. In the present case, the second dimension h2 of the second side surface 32B is larger than the first dimension h1 of the first side surface 32A. Also, the dimension b2 of the second side surface 32B in the first direction x is smaller than the dimension b1 of the first side surface 32A in the first direction X. With such a configuration, it is possible to make the volumes of the solder fillets formed on the terminals 30 uniform when the area of the mount surface 31 of the first terminal 30A is set larger than the area of the mount surface 31 of the second terminal 30B in order to reduce the concentration of thermal stress on the first terminal 30A. Therefore, a decrease in the bonding strength of the second terminal 30B to the circuit board, for example, can be suppressed.

In the semiconductor device A20, the reverse surface 12 of the die pad 10 is covered with the coating layer 60. Thus, when the thermal conductivity of the coating layer 60 is higher than that of the die pad 10, the heat dissipation of the semiconductor device A20 is further improved.

Moreover, because the semiconductor device A20 has a configuration in common with the semiconductor device A10, the effect of such configuration can be achieved by the semiconductor device A20 as well.

Third Embodiment

Figure 20:
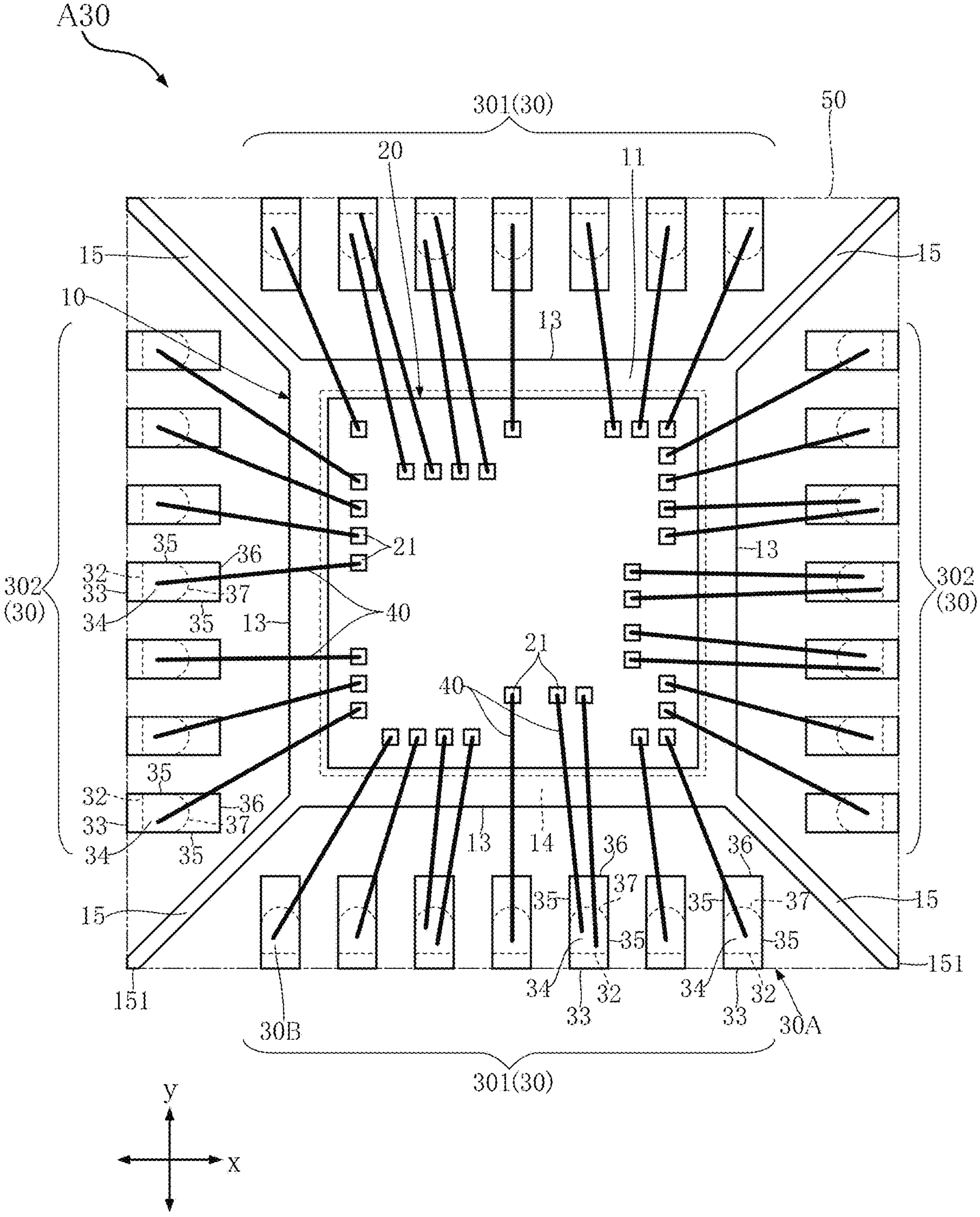
FIG. 20 is a plan view of a semiconductor device according to a third embodiment of the present disclosure as seen through the sealing resin.

A semiconductor device A30 according to a third embodiment of the present disclosure will be described based on FIGS. 20 to 24. In these figures, the elements that are identical or similar to those of the semiconductor device A10 described above are denoted by the same reference signs, and the descriptions thereof are omitted. For the convenience of understanding, the sealing resin 50 is transparent in FIG. 20. In FIG. 20, the outlines of the sealing resin 50 are indicated by imaginary lines. In FIGS. 21 to 24, the coating layer 60 is shown as dotted regions.

The semiconductor device A30 differs from the above-described semiconductor device A10 in configurations of the die pad 10 and terminals 30.

Figure 21:
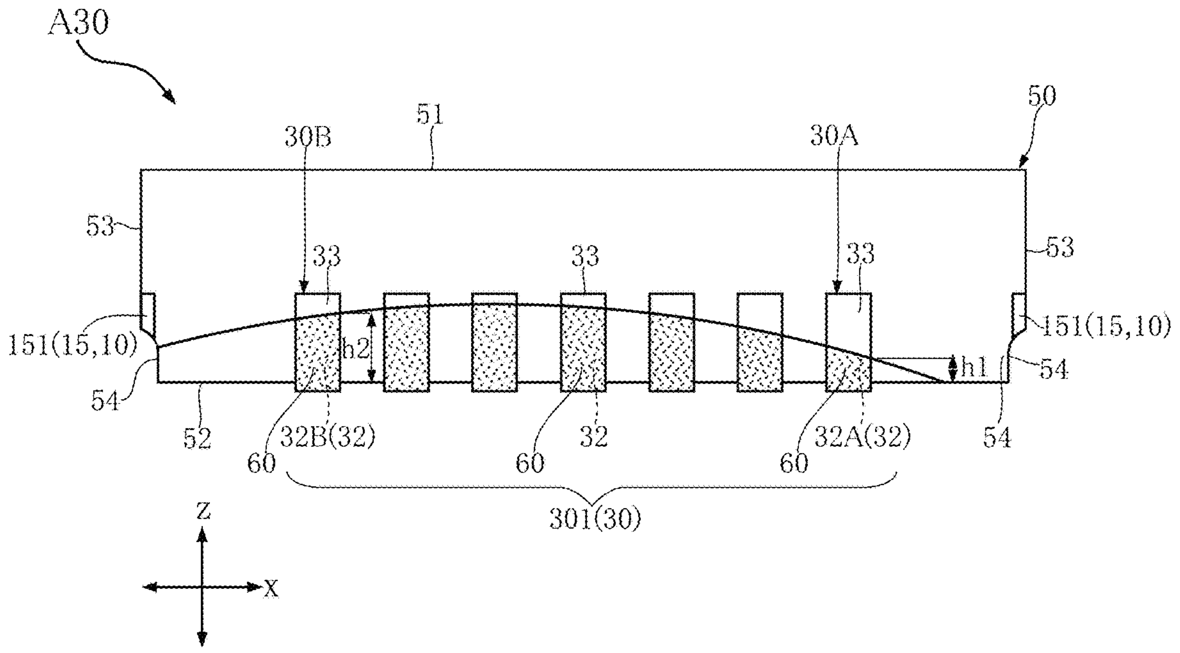
FIG. 21 is a front view of the semiconductor device shown in FIG. 20.
Figure 22:
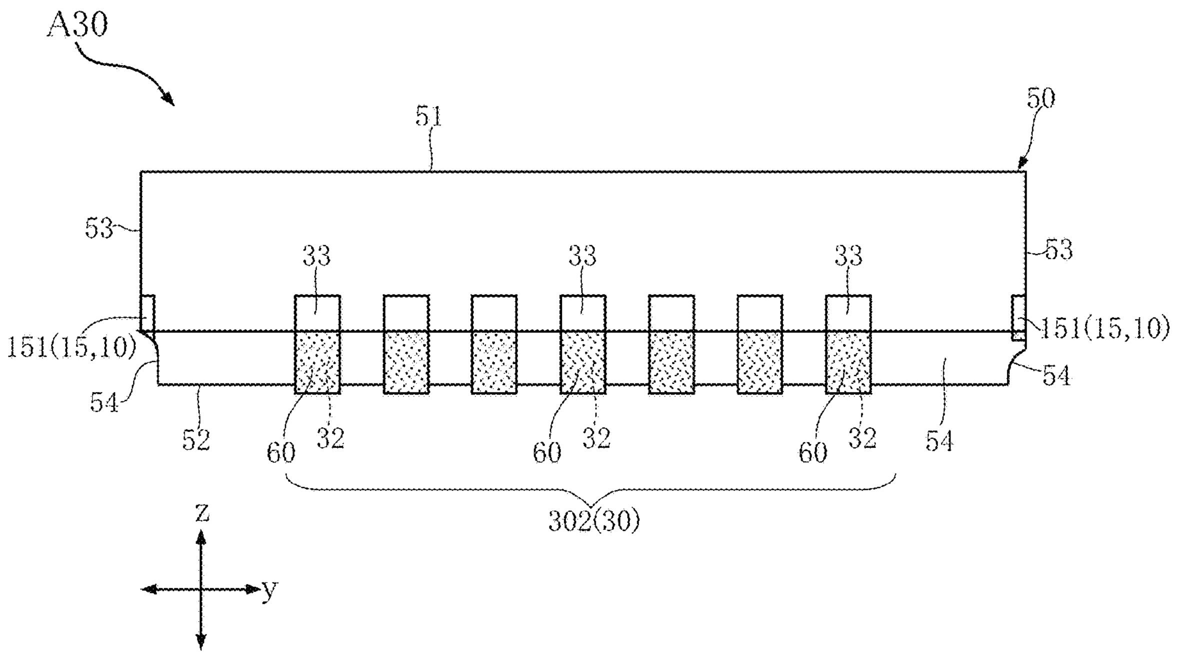
FIG. 22 is a left side view of the semiconductor device shown in FIG. 20.

As shown in FIGS. 21 and 22, the end surfaces 151 of the suspended portions 15 of the die pad 10 are exposed from the first side surface 53 of the sealing resin 50.

In the semiconductor device A30, of the two first terminal groups 301 and the two second terminal groups 302 each consisting of a plurality of terminals 30, only one first terminal group 301 includes the first terminal 30A and the second terminal 30B, as shown in FIGS. 20 to 22. In each group that does not include the first terminal 30A and the second terminal 30B (the other first terminal group 301 and two second terminal groups 302), the dimensions in the thickness direction z of the side surfaces 32 of the terminals 30 are all equal as shown in FIG. 22.

Figure 23:
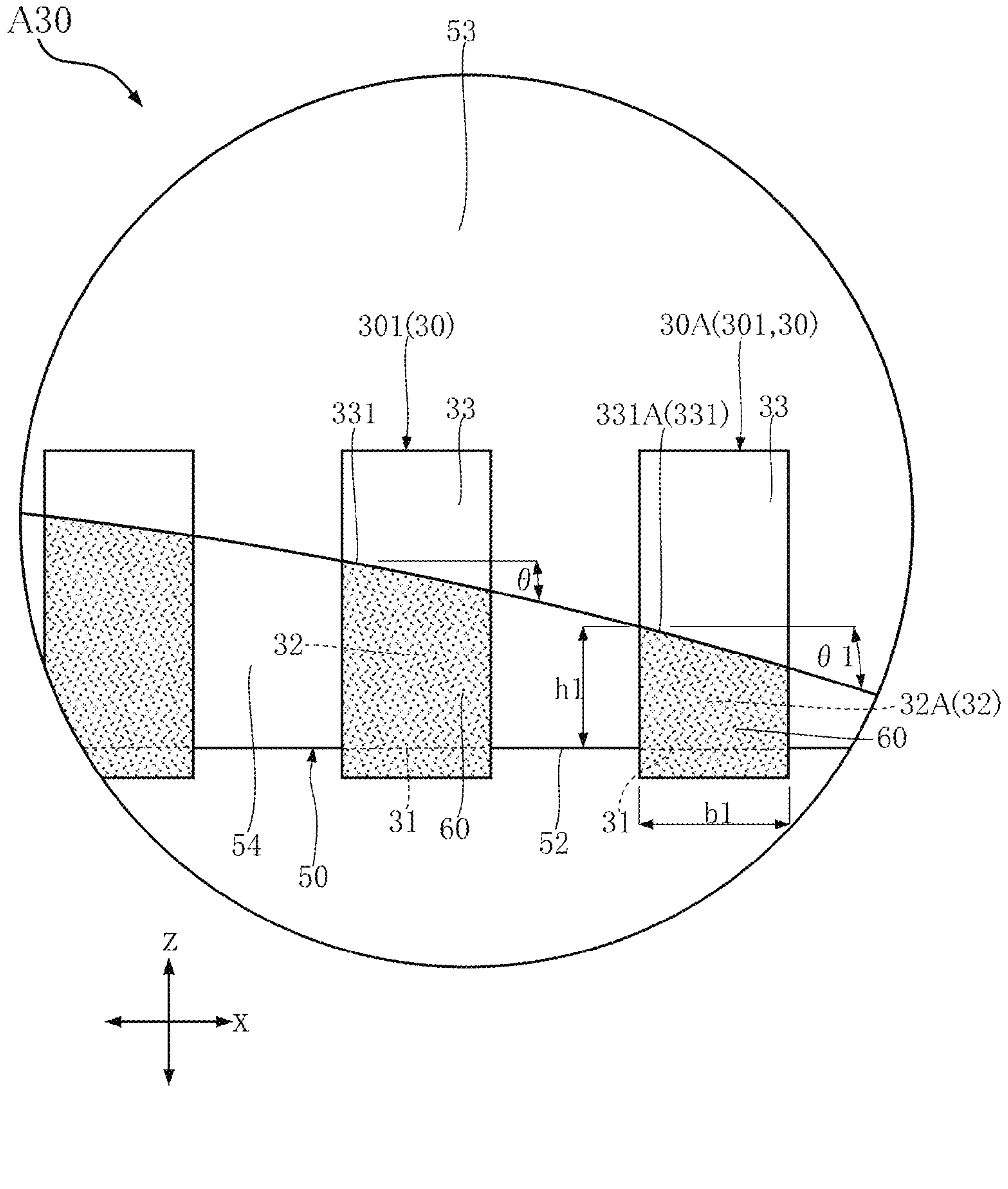
FIG. 23 is a partial enlarged view of the first terminal shown in FIG. 21 and a nearby portion.
Figure 24:
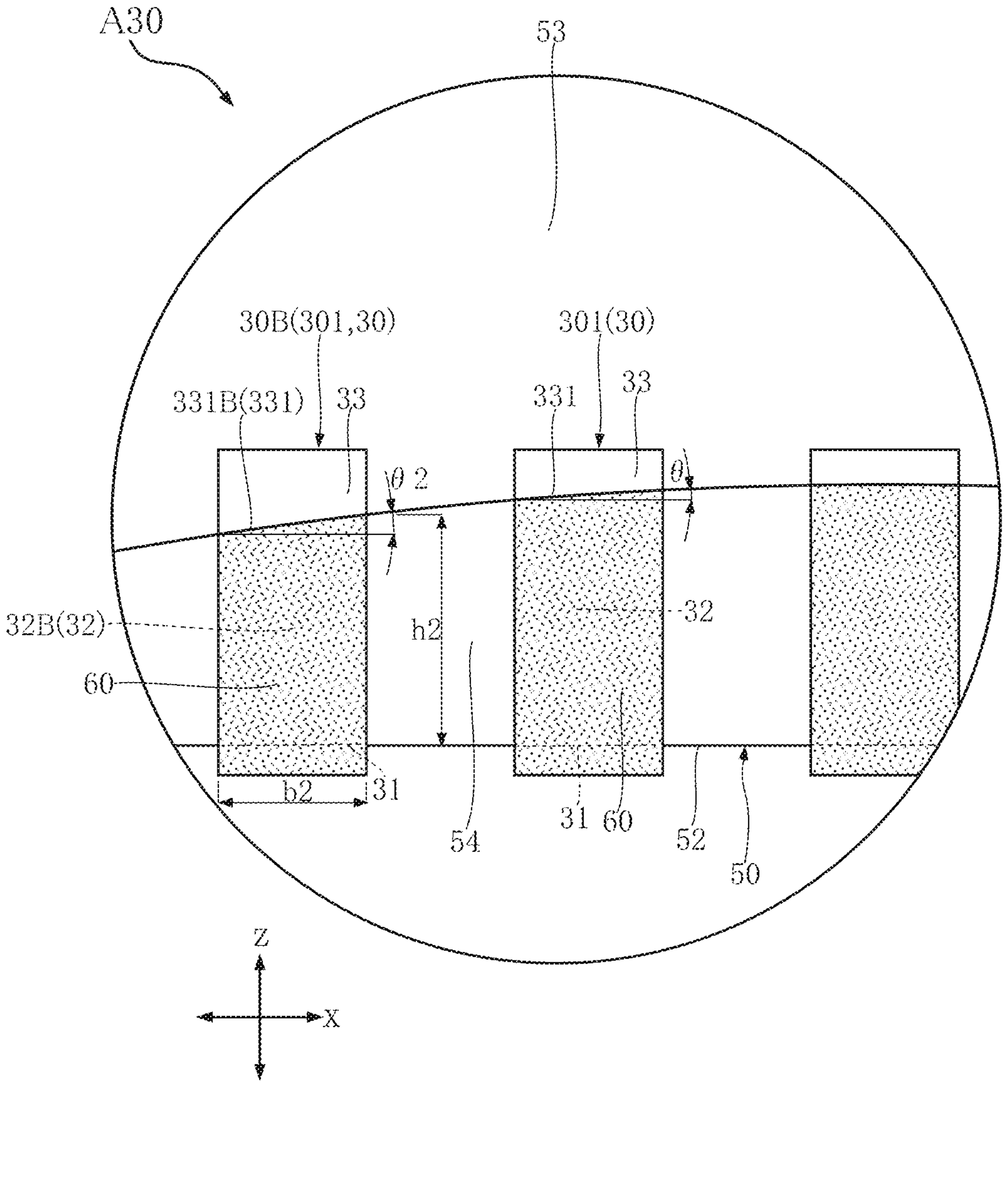
FIG. 24 is a partial enlarged view of the second terminal shown in FIG. 21 and a nearby portion.

As shown in FIG. 21, the second terminal 30B is located closest to the other end in the first direction x (the left end in the figure) of the sealing resin 50. Thus, the first terminal 30A and the second terminal 30B are located at opposite ends in the first direction x of the plurality of terminals 30 (the first terminal group 301). As shown in FIGS. 24 and 23, the second dimension h2 in the thickness direction z of the second side surface 32B of the second terminal 30B is larger than the first dimension h1 in the thickness direction z of the first side surface 32A of the first terminal 30A. Also, the dimension b2 of the second side surface 32B in the first direction x is equal to the dimension b1 of the first side surface 32A in the first direction x. As shown in FIG. 21, the boundary between the first side surface 53 and the second side surface 54 of the sealing resin 50 overlaps with an arc that is convex toward the top surface 51 of the sealing resin 50, as viewed in the second direction y.

Next, the effects of the semiconductor device A30 will be described.

The semiconductor device A30 includes terminals 30 arranged along the first direction x. Each of the terminals 30 has the mount surface 31 and the side surface 32. The mount surface 31 and the side surface 32 are exposed from the sealing resin 50. The plurality of terminals 30 include the first terminal 30A located closest to one end in the first direction x of the sealing resin 50 and the second terminal 30B spaced apart from the first terminal 30A. The side surfaces 32 of the terminals 30 include the first side surface 32A of the first terminal 30A and the second side surface 32B of the second terminal 30B. The second dimension h2 of the second side surface 32B in the thickness direction z differs from the first dimension h1 of the first side surface 32A in the thickness direction z. Thus, the semiconductor device A30 is also capable of having solder fillets of different heights formed on the terminals 30 when the semiconductor device A30 is mounted on a circuit board.

In the semiconductor device A30, the second terminal 30B is located closest to the other end in the first direction x of the sealing resin 50. Thus, the first terminal 30A and the second terminal 30B are located at opposite ends in the first direction x of the plurality of terminals 30. In this case again, the volume of the solder fillet formed on the first terminal 30A differs from the volume of the solder fillet formed on the second terminal 30B. Thus, when the semiconductor device A30 is mounted on a circuit board, the mount position of the semiconductor device A30 relative to the circuit board can be easily checked visually by comparing respective solder fillets formed on the first terminal 30A and the second terminal 30B.

Moreover, because the semiconductor device A30 has a configuration in common with the semiconductor device A10, the effect of such configuration can be achieved by the semiconductor device A30 as well.

The present disclosure is not limited to the above-described embodiments. Various modifications in design may be made freely in the specific structure of each part of the present disclosure.

The present disclosure includes embodiments described in the following clauses.

Clause 1.

A semiconductor device comprising:

a plurality of terminals arranged along a first direction orthogonal to a thickness direction;

a semiconductor element electrically connected to at least one of the plurality of terminals; and a sealing resin covering a part of each of the plurality of terminals and covering the semiconductor element, wherein each of the plurality of terminals includes a mount surface and a side surface connected to the mount surface, the mount surface faces in the thickness direction and is exposed from the sealing resin, the side surface faces in a second direction orthogonal to the thickness direction and the first direction and is exposed from the sealing resin, the plurality of terminals include a first terminal located closest to one end in the first direction of the sealing resin and a second terminal spaced apart from the first terminal, the side surfaces of the plurality of terminals include a first side surface that the first terminal has and a second side surface that the second terminal has, and a second dimension in the thickness direction of the second side surface differs from a first dimension in the thickness direction of the first side surface.

Clause 2.

The semiconductor device according to clause 1, wherein the second terminal is located closest to a center in the first direction of the sealing resin.

Clause 3.

The semiconductor device according to clause 2, wherein the second dimension is smaller than the first dimension.

Clause 4.

The semiconductor device according to clause 3, wherein the first dimension is the largest among dimensions in the thickness direction of the side surfaces of the plurality of terminals.

Clause 5.

The semiconductor device according to clause 3 or 4, wherein a dimension in the first direction of the first side surface is larger than a dimension in the first direction of the second side surface.

Clause 6.

The semiconductor device according to clause 5, wherein the dimension in the first direction of the first side surface is the largest among dimensions in the first direction of the side surfaces of the plurality of terminals.

Clause 7.

The semiconductor device according to clause 2, wherein the second dimension is larger than the first dimension.

Clause 8.

The semiconductor device according to clause 3 or 4, wherein the dimension in the first direction of the second side surface is smaller than the dimension in the first direction of the first side surface.

Clause 9.

The semiconductor device according to clause 1, wherein the second terminal is located closest to another end in the first direction of the sealing resin.

Clause 10.

The semiconductor device according to any one of clauses 1 to 9, further comprising a coating layer covering the mount surface and the side surface, wherein the coating layer contains a metal element.

Clause 11.

The semiconductor device according to any one of clauses 1 to 10, wherein each of the plurality of terminals includes an end surface facing in the second direction and exposed from the sealing resin, the end surface is located opposite to the mount surface with respect to the side surface in each of the thickness direction and the second direction, and the end surface is connected to the side surface.

Clause 12.

The semiconductor device according to clause 11, wherein a first boundary between the first side surface and the end surface of the first terminal is inclined with respect to the first direction.

Clause 13.

The semiconductor device according to clause 12, wherein a second boundary between the second side surface and the end surface of the second terminal is inclined with respect to the first direction, and an inclination angle of the second boundary with respect to the first direction is smaller than an inclination angle of the first boundary with respect to the first direction.

Clause 14.

The semiconductor device according to clause 12 or 13, wherein the inclination angle of the first boundary with respect to the first direction is the largest among inclination angles of boundaries between the side surfaces and the end surfaces of the plurality of terminals with respect to the first direction.

Clause 15.

The semiconductor device according to any one of clauses 11 to 13, wherein each of the plurality of terminals includes a connecting surface facing away from the mount surface in the thickness direction and connected to the end surface, and an area of the connecting surface is larger than an area of the mount surface.

Clause 16.

The semiconductor device according to clause 15, further comprising a wire conductively bonded to the semiconductor element and the connecting surface of one of the plurality of terminals.

Clause 17.

The semiconductor device according to any one of clauses 1 to 16, further comprising a die pad spaced apart from the plurality of terminals, wherein the semiconductor element is mounted on the die pad, the die pad includes a reverse surface facing a same side as the mount surface in the thickness direction, and the reverse surface is exposed from the sealing resin.

REFERENCE NUMERALS

| | |
|---|---|
| A10, A20, A30: Semiconductor device | 10: Die pad |
| 11: Mount surface | 12: Reverse surface |
| 13: Peripheral surface | 14: Peripheral groove |

-continued

| REFERENCE NUMERALS | |
|---|---|
| 15: Suspended portion | 151: End surface |
| 20: Semiconductor element | 21: Electrode |
| 29: Bonding layer | 30: Terminal |
| 301: First terminal group | 302: Second terminal group |
| 30A: First terminal | 30B: Second terminal |
| 31: Mount surface | 32: Side surface |
| 32A: First side surface | 32B: Second side surface |
| 33: End surface | 331: Boundary |
| 331A: First boundary | 331B: Second boundary |
| 34: Connecting surface | 35: Inner side surface |
| 36: Fourth bonding layer | 37: Curved surface |
| 40: Wire | 50: Sealing resin |
| 51: Top surface | 52: Bottom surface |
| 53: First side surface | 54: Second side surface |
| 60: Coating layer | 80: Groove |
| 81: Tape | 82: Blade |
| h1: First dimension | h2: Second dimension |
| θ1, θ2, θ: Inclination angle | z: Thickness direction |
| x: First direction | y: Second direction |

The invention claimed is:

1. A semiconductor device comprising:

a plurality of terminals arranged along a first direction orthogonal to a thickness direction;

a semiconductor element electrically connected to at least one of the plurality of terminals; and a sealing resin covering a part of each of the plurality of terminals and covering the semiconductor element, wherein each of the plurality of terminals includes a mount surface and a side surface connected to the mount surface, the mount surface faces in the thickness direction and is exposed from the sealing resin, the side surface faces in a second direction orthogonal to the thickness direction and the first direction and is exposed from the sealing resin, the plurality of terminals include a first terminal located closest to one end in the first direction of the sealing resin and a second terminal spaced apart from the first terminal, the side surfaces of the plurality of terminals include a first side surface that the first terminal has and a second side surface that the second terminal has, and a second dimension in the thickness direction of the second side surface differs from a first dimension in the thickness direction of the first side surface.

2. The semiconductor device according to claim 1, wherein the second terminal is located closest to a center in the first direction of the sealing resin.

3. The semiconductor device according to claim 2, wherein the second dimension is smaller than the first dimension.

4. The semiconductor device according to claim 3, wherein the first dimension is the largest among dimensions in the thickness direction of the side surfaces of the plurality of terminals.

5. The semiconductor device according to claim 3, wherein a dimension in the first direction of the first side surface is larger than a dimension in the first direction of the second side surface.

6. The semiconductor device according to claim 5, wherein the dimension in the first direction of the first side surface is the largest among dimensions in the first direction of the side surfaces of the plurality of terminals.

7. The semiconductor device according to claim 3, wherein the dimension in the first direction of the second side surface is smaller than the dimension in the first direction of the first side surface.

8. The semiconductor device according to claim 2, wherein the second dimension is larger than the first dimension.

9. The semiconductor device according to claim 1, wherein the second terminal is located closest to another end in the first direction of the sealing resin.

10. The semiconductor device according to claim 1, further comprising a coating layer covering the mount surface and the side surface, wherein the coating layer contains a metal element.

11. The semiconductor device according to claim 1, wherein each of the plurality of terminals includes an end surface facing in the second direction and exposed from the sealing resin, the end surface is located opposite to the mount surface with respect to the side surface in each of the thickness direction and the second direction, and the end surface is connected to the side surface.

12. The semiconductor device according to claim 11, wherein a first boundary between the first side surface and the end surface of the first terminal is inclined with respect to the first direction.

13. The semiconductor device according to claim 12, wherein a second boundary between the second side surface and the end surface of the second terminal is inclined with respect to the first direction, and an inclination angle of the second boundary with respect to the first direction is smaller than an inclination angle of the first boundary with respect to the first direction.

14. The semiconductor device according to claim 12, wherein the inclination angle of the first boundary with respect to the first direction is the largest among inclination angles of boundaries between the side surfaces and the end surfaces of the plurality of terminals with respect to the first direction.

15. The semiconductor device according to claim 11, wherein each of the plurality of terminals includes a connecting surface facing away from the mount surface in the thickness direction and connected to the end surface, and an area of the connecting surface is larger than an area of the mount surface.

16. The semiconductor device according to claim 15, further comprising a wire conductively bonded to the semiconductor element and the connecting surface of one of the plurality of terminals.

17. The semiconductor device according to claim 1, further comprising a die pad spaced apart from the plurality of terminals, wherein the semiconductor element is mounted on the die pad, the die pad includes a reverse surface facing a same side as the mount surface in the thickness direction, and the reverse surface is exposed from the sealing resin.

* * * * *